(12) United States Patent
Shionoiri

(10) Patent No.: US 8,222,735 B2
(45) Date of Patent: Jul. 17, 2012

(54) SEMICONDUCTOR DEVICE AND COMMUNICATION SYSTEM USING THE SEMICONDUCTOR DEVICE

(75) Inventor: Yutaka Shionoiri, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 893 days.

(21) Appl. No.: 11/546,465

(22) Filed: Oct. 12, 2006

(65) Prior Publication Data
US 2007/0085202 A1   Apr. 19, 2007

(30) Foreign Application Priority Data
Oct. 14, 2005   (JP) .................. 2005-300971

(51) Int. Cl.
*H01L 23/48* (2006.01)
(52) U.S. Cl. .......... 257/734; 257/528; 257/207; 257/72; 257/59; 257/208; 257/728; 257/E27.111; 257/E29.271
(58) Field of Classification Search .................. 257/734, 257/528, 207, 72, 59, 208, 728, E27.111, 257/E29.271
See application file for complete search history.

(56) References Cited

U.S. PATENT DOCUMENTS

| | | | |
|---|---|---|---|
| 5,416,356 A | 5/1995 | Staudinger et al. | |
| 5,481,131 A | 1/1996 | Staudinger et al. | |
| 5,705,852 A | 1/1998 | Orihara et al. | |
| 6,083,785 A | 7/2000 | Segawa et al. | |
| 6,160,526 A | 12/2000 | Hirai et al. | |
| 6,603,172 B1 | 8/2003 | Segawa et al. | |
| 6,816,125 B2 | 11/2004 | Kuhns et al. | |
| 6,838,773 B2 | 1/2005 | Kikuchi et al. | |
| 7,168,623 B1 | 1/2007 | Royer | |
| 7,408,196 B2 | 8/2008 | Kurokawa | |
| 7,471,188 B2 | 12/2008 | Koyama et al. | |
| 8,058,672 B2 | 11/2011 | Kurokawa | |
| 2003/0029921 A1* | 2/2003 | Akita et al. ................. 235/492 |
| 2003/0116790 A1* | 6/2003 | Kikuchi et al. ............. 257/208 |
| 2003/0136503 A1 | 7/2003 | Green et al. | |
| 2004/0135175 A1 | 7/2004 | Kurokawa | |

(Continued)

FOREIGN PATENT DOCUMENTS
EP   0737935 A   10/1996

(Continued)

OTHER PUBLICATIONS

International Search Report (Application No. PCT/JP2006/320361) dated Dec. 19, 2006.

(Continued)

*Primary Examiner* — Junghwa M Im
(74) *Attorney, Agent, or Firm* — Eric J. Robinson; Robinson Intellectual Property Law Office, P.C.

(57) ABSTRACT

With respect to a semiconductor device which communicates data by wireless communication, an object of the present invention is to improve sensitivity of an antenna and to protect a chip from noise without increasing the size of the device. A coiled antenna and a semiconductor integrated circuit which is electrically connected to the coiled antenna are included. The semiconductor integrated circuit is arranged so as to overlap with the coiled antenna. In this manner, arrangement of the coiled antenna and the semiconductor integrated circuit in the semiconductor device is devised, so that sensitivity of the antenna can be improved and power enough to operate the semiconductor integrated circuit can be obtained without increasing the size of the device.

24 Claims, 14 Drawing Sheets

U.S. PATENT DOCUMENTS

| | | |
|---|---|---|
| 2004/0164302 A1* | 8/2004 | Arai et al. ............... 257/72 |
| 2004/0190085 A1 | 9/2004 | Silverbrook et al. |
| 2004/0190092 A1 | 9/2004 | Silverbrook et al. |
| 2005/0001785 A1* | 1/2005 | Ferguson et al. ......... 343/895 |
| 2005/0135181 A1 | 6/2005 | Shionoiri et al. |
| 2005/0148121 A1 | 7/2005 | Yamazaki et al. |
| 2005/0180187 A1 | 8/2005 | Koyama |
| 2005/0250308 A1 | 11/2005 | Yamaguchi et al. |
| 2005/0252605 A1 | 11/2005 | Green et al. |
| 2007/0216534 A1 | 9/2007 | Ferguson et al. |

FOREIGN PATENT DOCUMENTS

| | | | |
|---|---|---|---|
| EP | 0814499 A | 12/1997 | |
| FR | 2785072 A | 4/2000 | |
| JP | 10-004179 A | 1/1998 | |
| JP | 11-011058 | 1/1999 | |
| JP | 2001-237276 | 8/2001 | |
| JP | 2002-049903 | 2/2002 | |
| JP | 2002049903 A | * | 2/2002 |
| JP | 2002-216093 | 8/2002 | |
| JP | 2004-031936 A | 1/2004 | |
| JP | 2004-221559 A | 8/2004 | |
| JP | 2004-273538 A | 9/2004 | |
| JP | 2005-056221 | 3/2005 | |
| JP | 2005-203079 | 7/2005 | |
| JP | 2005-204493 A | 7/2005 | |
| WO | WO 2001/099193 | 12/2001 | |
| WO | WO-2004/080138 | 9/2004 | |
| WO | WO 2006/028195 | 3/2006 | |

OTHER PUBLICATIONS

Written Opinion (Application No. PCT/JP2006/320361) dated Dec. 19, 2006.

Search Report (Application No. 06811658.1) Dated Oct. 2, 2009.

* cited by examiner

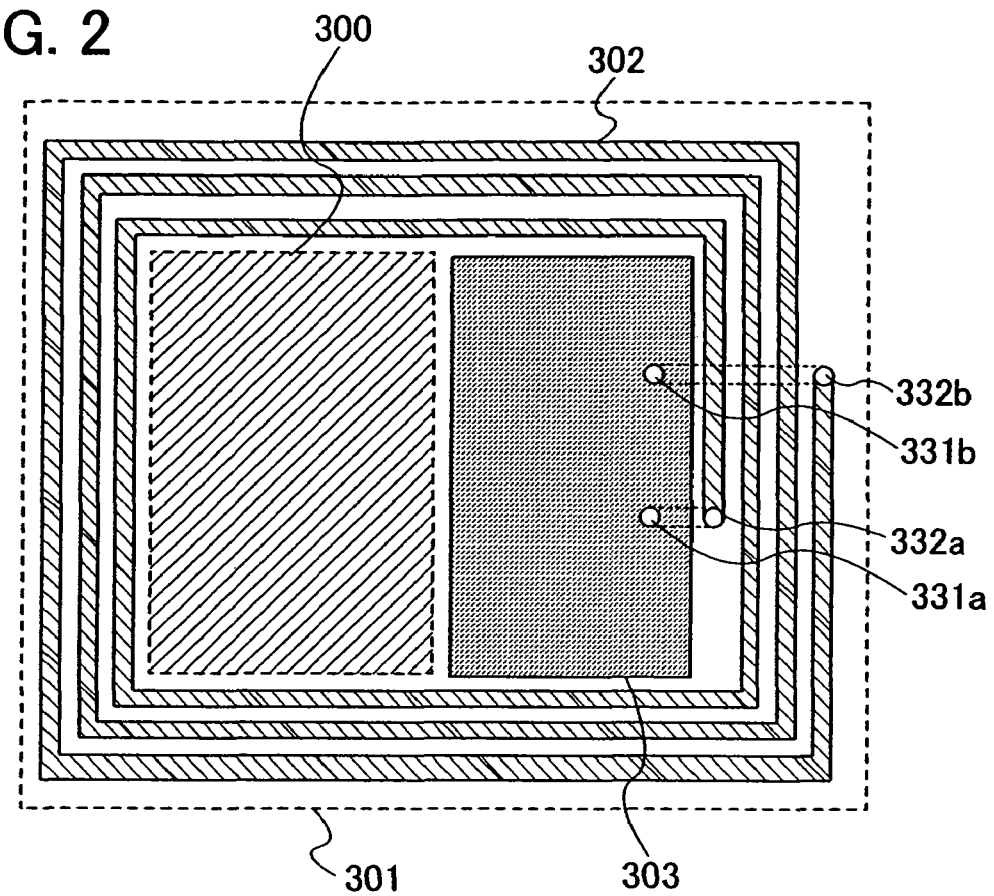

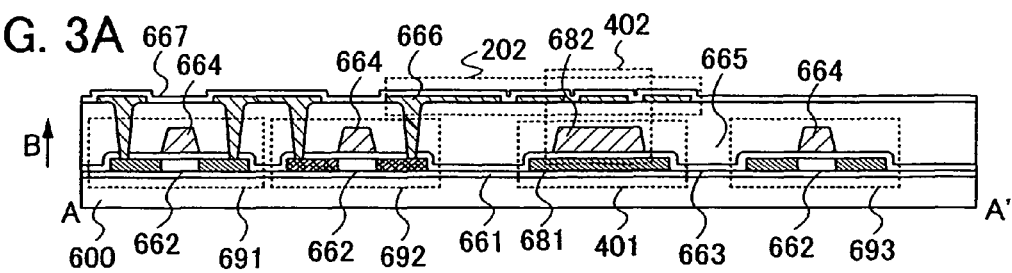
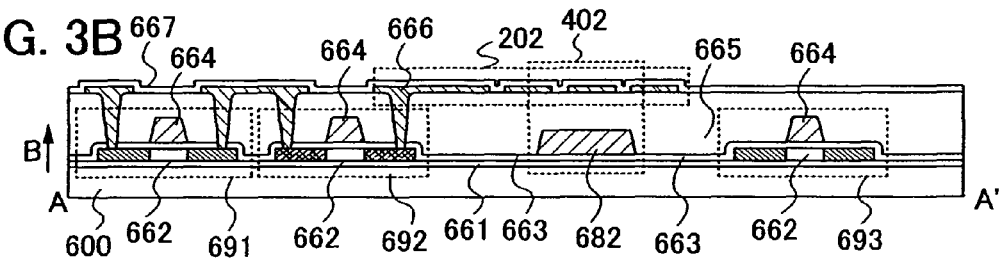
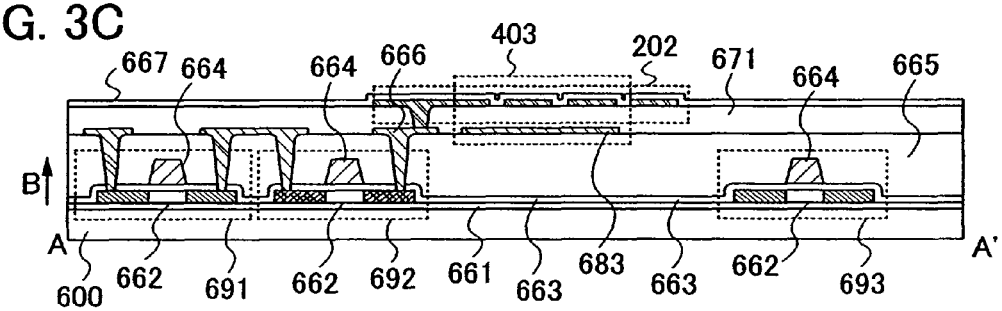
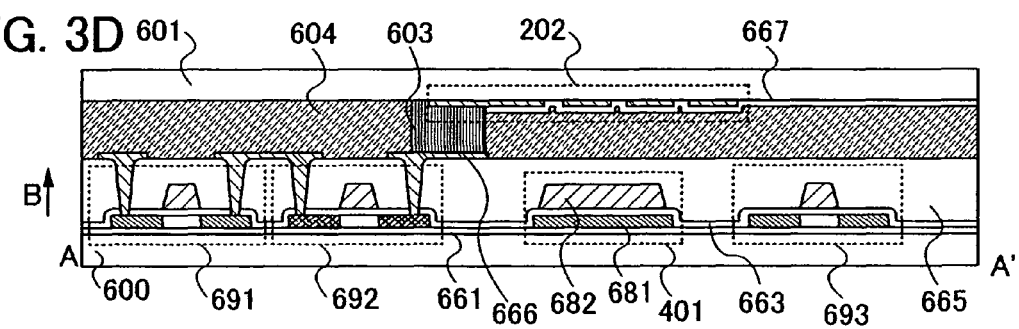
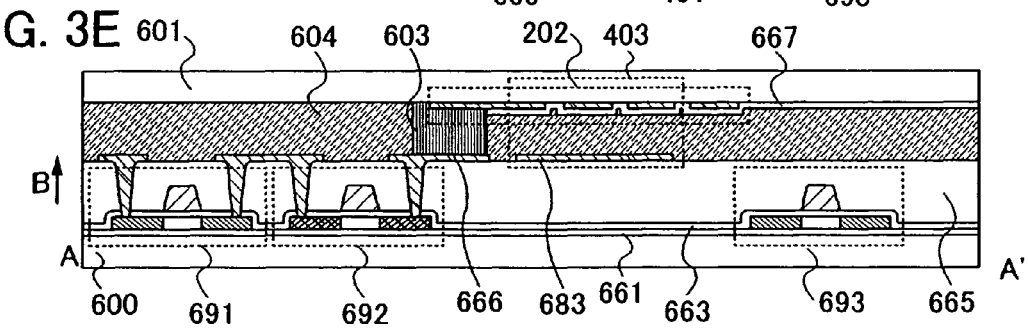

SEMICONDUCTOR DEVICE AND COMMUNICATION SYSTEM USING THE SEMICONDUCTOR DEVICE

TECHNICAL FIELD

The present invention relates to a semiconductor device which communicates (receives and transmits) data by wireless communication. In particular, the present invention relates to a semiconductor device which communicates data by electromagnetic induction. The present invention further relates to a communication system which uses the semiconductor device, an antenna and a reader/writer which communicate data with the semiconductor device.

BACKGROUND ART

Nowadays, an individual identification technology using wireless communication has attracted attention. In particular, as a semiconductor device which communicates data by wireless communication, an individual identification technology using an RFID (Radio Frequency Identification) tag has attracted attention. The RFID tag is also called an IC (Integrated Circuit) tag, an IC chip, an RF tag, a wireless tag, or an electronic tag. The individual identification technology using an RFID tag has started to help production of an individual object or management, and has been developed to be applied to personal authentication.

Among RFID tags, there is a semiconductor device which communicates data by electromagnetic induction (Reference 1: Japanese Published Patent Application No. H11-11058). A conventional semiconductor device is described with reference to FIG. 2.

A semiconductor device 301 which communicates data by electromagnetic induction includes a coiled antenna 302 and a semiconductor integrated circuit 303 connected to the coiled antenna 302. Note that as shown by dotted lines in FIG. 2, a terminal 331a of the semiconductor integrated circuit 303 is connected to one end 332a of the coiled antenna 302, and a terminal 331b of the semiconductor integrated circuit 303 is connected to the other end 332b of the coiled antenna 302.

When the semiconductor device 301 is brought close to a coiled antenna connected to a reader/writer, an AC magnetic field is generated from the coiled antenna connected to the reader/writer. The AC magnetic field passes through the coiled antenna 302 in the semiconductor device 301, and electromotive force is generated between the terminals (between the one end 332a and the other end 332b) of the coiled antenna 302 in the semiconductor device 301 by electromagnetic induction. The semiconductor integrated circuit 303 in the semiconductor device 301 is operated by electromotive force.

In the conventional semiconductor device 301 which communicates data by using electromagnetic induction, the coiled antenna 302 and the semiconductor integrated circuit 303 do not overlap with each other. Here, the fact that the coiled antenna and the semiconductor integrated circuit do not overlap with each other means that the semiconductor integrated circuit and a portion of a wiring, which forms a coil of the coiled antenna do not overlap with each other when viewed from a direction parallel to a central axis of the coiled antenna. The portion of the wiring, which forms the coil of the antenna means that portions of a wiring provided adjacent to each other at regular intervals in the antenna. Note that the semiconductor integrated circuit includes not only an element which forms a circuit but also a power source line, a leading wiring, or the like. In addition, in the conventional semiconductor device 301, the semiconductor integrated circuit 303 is arranged inside the coil of the coiled antenna 302. Accordingly, an area of a portion (referred to as a region 300 in FIG. 2) inside the coil of the coiled antenna 302, in which the semiconductor integrated circuit 303 is not formed is small. Thus, a magnetic flux which passes through the coiled antenna 302 in the aforementioned AC magnetic field is small. Therefore, since sensitivity of the antenna decreases, electromotive force generated by electromagnetic induction is small. Since electromotive force is small, there is a possibility that the semiconductor integrated circuit 303 is not operated.

In addition, even when electromotive force with a degree that the semiconductor integrated circuit 303 to operate is obtained, in a case where electromotive force is small, momentary variation of electromotive force due to noise or the like affects significantly, and electromotive force is momentarily decreased, so that the semiconductor integrated circuit 303 would not be operated.

Note that, in order to ensure an area of a portion inside the coil of the coiled antenna 302, in which the semiconductor integrated circuit 303 is not formed, there is a method in which a semiconductor integrated circuit is provided outside a coiled antenna. However, this method leads to make a large semiconductor device.

In view of the situation above, with respect to a semiconductor device which communicates data by wireless communication, an object of the present invention is to improve sensitivity of an antenna and to protect a semiconductor integrated circuit from noise or the like without increasing the size of the semiconductor device.

The present invention is a semiconductor device including the following structure in order to solve the problems described above.

A semiconductor device of the present invention includes a coiled antenna (including a loop antenna and a spiral antenna) and a semiconductor integrated circuit which is electrically connected to the coiled antenna. The semiconductor integrated circuit is arranged so as to overlap with the coiled antenna.

A semiconductor device of the present invention includes a circular coiled antenna and a semiconductor integrated circuit which is electrically connected to the coiled antenna. The semiconductor integrated circuit is arranged so as to overlap with the circular coiled antenna.

A semiconductor device of the present invention includes a triangular coiled antenna and a semiconductor integrated circuit which is electrically connected to the coiled antenna. The semiconductor integrated circuit is arranged so as to overlap with at least one side of the triangular coiled antenna. Note that the semiconductor device may be arranged so as to overlap with one side of the triangular coiled antenna and not to overlap with the other sides thereof.

A semiconductor device of the present invention includes a square coiled antenna and a semiconductor integrated circuit which is electrically connected to the coiled antenna. The semiconductor integrated circuit is arranged so as to overlap with at least one side of the square coiled antenna. Note that the semiconductor integrated circuit may be arranged so as to overlap with one side of the square coiled antenna and not to overlap with the other sides thereof.

A semiconductor device of the present invention includes a polygonal coiled antenna and a semiconductor integrated circuit which is electrically connected to the coiled antenna. The semiconductor integrated circuit is arranged so as to overlap with at least one side of the polygonal coiled antenna. Note that the semiconductor integrated circuit may be arranged so as to overlap with one side of the polygonal coiled antenna and not to overlap with the other sides thereof.

Here, the fact that the coiled antenna and the semiconductor integrated circuit overlap with each other means that the semiconductor integrated circuit and a portion of a wiring, which forms a coil of the coiled antenna overlap with each other when viewed from a direction parallel to a central axis of the coiled antenna. The portion of the wiring, which forms the coil of the antenna means that portions of a wiring provided adjacent to each other at regular intervals in the antenna. Note that the semiconductor integrated circuit includes not only an element which forms a circuit but also a power source line, a leading wiring, or the like.

The semiconductor integrated circuit is operated by electromotive force generated by electromagnetic induction in the coiled antenna as power source voltage.

In a semiconductor device of the present invention, a transistor is not necessarily included in a region where a coiled antenna in a semiconductor integrated circuit overlaps with the semiconductor integrated circuit. Note that at least a channel forming region of a transistor is not included in the region where the coiled antenna in the semiconductor integrated circuit overlaps with the semiconductor integrated circuit.

In addition, a semiconductor device of the present invention may include a digital circuit and an analog circuit, and the digital circuit may be arranged in a region where the coiled antenna in the semiconductor integrated circuit overlaps with the semiconductor integrated circuit.

Further, a semiconductor device of the present invention includes a capacitor in a region where the semiconductor integrated circuit overlaps with the coiled antenna.

The capacitor may be electrically connected to the antenna. The capacitor may be a resonant capacitor connected to the coiled antenna in parallel. The resonant capacitor is a capacitor, and the capacitor and the coiled antenna form a resonance circuit.

In addition, the capacitor may be a storage capacitor for holding power source voltage of the semiconductor integrated circuit.

Note that the capacitor may be one of elements included in the semiconductor integrated circuit.

Alternatively, the capacitor may have a structure in which a part of a wiring of the coiled antenna is used as one electrode, a part of a wiring of or an electrode of the semiconductor integrated circuit is used as the other electrode, and an insulating film is sandwiched between the one electrode and the other electrode. The other electrode may be a part of a wiring in the semiconductor integrated circuit, in which a predetermined potential is held. In addition, the other electrode may be a power source line of the semiconductor integrated circuit. The power source line may be arranged so as to surround an element included in the semiconductor integrated circuit. Note that the potential of the power source line needs to be kept at a predetermined level when a radio signal is supplied to the semiconductor device.

Note that the coiled antenna and the semiconductor integrated circuit may be separately formed over different substrates to be attached to each other or may be formed over one substrate.

The number of windings of the coiled antenna may be one or more.

The semiconductor integrated circuit may be formed over a single crystal semiconductor substrate such as a silicon wafer or may be formed over an insulating substrate by using a thin film transistor.

An active layer of the thin film transistor may be formed of an amorphous semiconductor or may be formed of a crystalline semiconductor.

A semiconductor device of the present invention includes a coiled antenna and a semiconductor integrated circuit which is electrically connected to the coiled antenna, and the semiconductor integrated circuit is arranged so as to overlap with the coiled antenna. In addition, in a case where the coiled antenna is square, triangular, or polygonal, a semiconductor integrated circuit is arranged so as to overlap with one side of the coiled antenna and not to overlap with the other sides of them. Therefore, compared to a case where a coiled antenna is not overlapped with a semiconductor integrated circuit as is conventional, an area of a portion inside a coil of a coiled antenna, in which a semiconductor integrated circuit is not formed can be enlarged.

Thus, in an AC magnetic field generated from an antenna connected to a reader/writer, a magnetic flux which passes through a coiled antenna can be increased. Therefore, electromotive force generated by electromagnetic induction can be increased. As for a semiconductor device of the present invention, since electromotive force is increased, a semiconductor integrated circuit is easily operated. Thus, arrangement of the coiled antenna and the semiconductor integrated circuit in the semiconductor device is devised, so that sensitivity of the antenna can be improved and power enough to operate the semiconductor integrated circuit can be obtained without increasing the size of the device. In addition, a communication distance can be improved.

Further, a structure in which a transistor (at least a channel forming region of the transistor) is not included in a region where a coiled antenna overlaps with the semiconductor integrated circuit is used. In this manner, when the coiled antenna communicates, a direct effect on a transistor due to noise on a signal or the like or variation of electromotive force generated by electromagnetic induction or the like can be suppressed and malfunction of a semiconductor integrated circuit can be reduced.

In addition, a semiconductor device of the present invention may have a structure in which a digital circuit and an analog circuit are included and the digital circuit is arranged in a region where a coiled antenna overlaps with the semiconductor integrated circuit. The digital circuit is less affected by noise than the analog circuit. Therefore, by arranging the digital circuit in the region where the coiled antenna overlaps with the semiconductor integrated circuit, a semiconductor device can be downsized and malfunction of the semiconductor integrated circuit can be reduced.

Furthermore, a semiconductor device of the present invention includes a capacitor in a region where a semiconductor integrated circuit overlaps with a coiled antenna. The capacitor can suppress an absolute value of change in the potential due to variation of electromotive force caused by noise or the like. That is, the momentary variation of electromotive force due to noise or the like can be mitigated, and the semiconductor integrated circuit can be easily operated.

In addition, by providing a capacitor to be a resonant capacitor in a region where a semiconductor integrated circuit overlaps with a coiled antenna, a semiconductor device can be further downsized.

Note that by providing the capacitor included in the semiconductor integrated circuit in the region where the semiconductor integrated circuit overlaps with the coiled antenna, the semiconductor device can be further downsized as well as an advantage that the momentary variation of electromotive force due to the aforementioned noise or the like can be mitigated.

Alternatively, the capacitor can have a structure in which a part of a wiring of a coiled antenna is used as one electrode, a part of a wiring of or an electrode of a semiconductor integrated circuit is used as the other electrode, and an insulating film is sandwiched between the one electrode and the other electrode. The other electrode may be a part of a wiring in the semiconductor integrated circuit, in which a predetermined potential is held. The wiring in which the predetermined potential is held may be a power source line of the semiconductor integrated circuit. Accordingly, without increasing the number of wirings, a capacitor can be formed in a region where the semiconductor integrated circuit overlaps with the coiled antenna.

Moreover, the power source line may be arranged so as to surround an element included in the semiconductor integrated circuit. In this manner, the semiconductor integrated circuit can be shielded from noise outside the circuit or the like and the momentary variation of electromotive force due to noise or the like can be mitigated, and reliability of the semiconductor integrated circuit can be enhanced.

Note that the coiled antenna and the semiconductor integrated circuit may be separately formed over different substrates to be attached to each other or may be formed over one substrate. In particular, in the case where the coiled antenna and the semiconductor integrated circuit are formed over one substrate, distance between a wiring of the coiled antenna and an electrode or wiring of the semiconductor integrated circuit can be set short. Therefore, in the case of providing a capacitor having a structure in which a part of a wiring of the coiled antenna is used as one electrode, an electrode or a part of a wiring of the semiconductor integrated circuit is used as the other electrode, and an insulating film is sandwiched between the one electrode and the other electrode; area of the electrode in the capacitor can be small, and providing the capacitor is especially effective in downsizing a semiconductor device or the like.

The semiconductor integrated circuit may be formed over a single crystal semiconductor substrate such as a silicon wafer or may be formed over an insulating substrate by using a thin film transistor. In particular, in the case of forming the semiconductor integrated circuit over the insulating substrate by using the thin film transistor, the area of the semiconductor integrated circuit is larger than a circuit formed over a single crystal semiconductor substrate. Therefore, in the case of forming a semiconductor integrated circuit over an insulating substrate by using a thin film transistor, a structure in which the semiconductor integrated circuit is arranged so as to overlap with a coiled antenna is especially effective in downsizing a semiconductor device or the like.

BRIEF DESCRIPTION OF DRAWINGS

FIG. 2 shows a structure of a conventional semiconductor device.

FIGS. 3A to 3E each show a structure of a semiconductor device of Embodiment Mode 2.

BEST MODE FOR CARRYING OUT THE INVENTION

Embodiment Mode

Figure 1A:
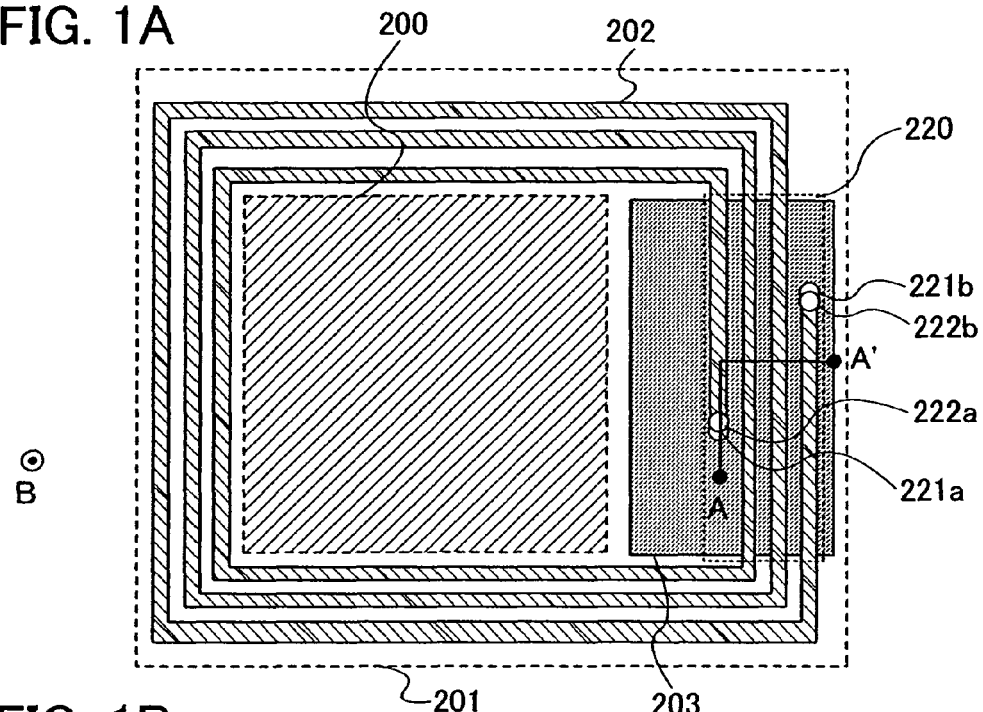
FIGS. 1A to 1C each show a structure of a semiconductor device of Embodiment Mode 1.

Embodiment modes of the present invention are described in detail with reference to the drawings. However, the present invention is not limited to the following description, and it is to be easily understood by those skilled in the art that modes and details can be changed variously without departing from the purpose and the scope of the present invention. Therefore, the present invention should not be interpreted as being limited to the following description of embodiment modes. In the structure of the present invention described hereinafter, reference numerals and symbols indicating the same things are used in common in the different drawings.

In addition, in the present invention, "to be connected" is synonymous with "to be electrically connected"; therefore, another element or the like may be interposed.

Embodiment Mode 1

In Embodiment Mode 1, a structure of a semiconductor device of the present invention which communicates data by wireless communication and operation of the semiconductor device is described.

First, a structure of a semiconductor device of the present invention which communicates data by wireless communication is described with reference to FIGS. 1A to 1C, and 9A to 10D.

FIG. 1A is a top view of a semiconductor device of the present invention. As shown in FIG. 1A, a semiconductor device 201 includes a square coiled antenna 202 and a semiconductor integrated circuit 203. A terminal 221a of the semiconductor integrated circuit 203 is electrically connected to one end 222a of the coiled antenna 202. A terminal 221b of the semiconductor integrated circuit 203 is electrically connected to the other end 222b of the coiled antenna 202. The coiled antenna 202 and the semiconductor integrated circuit 203 are arranged so that the semiconductor integrated circuit 203 overlaps with at least one side of the square coiled antenna 202.

Note that the fact that the coiled antenna 202 and the semiconductor integrated circuit 203 overlap with each other means that, when viewed from a direction (a direction perpendicular to a paper surface in FIG. 1A) parallel to a central axis of the coiled antenna 202, the semiconductor integrated circuit 203 and a portion of a wiring, which forms a coil of the coiled antenna 202 overlap with each other. The part of the wiring of the coiled antenna 202 overlapping with the semiconductor integrated circuit 203 is denoted by a part 220 of the wiring in FIG. 1A.

Figure 1B:
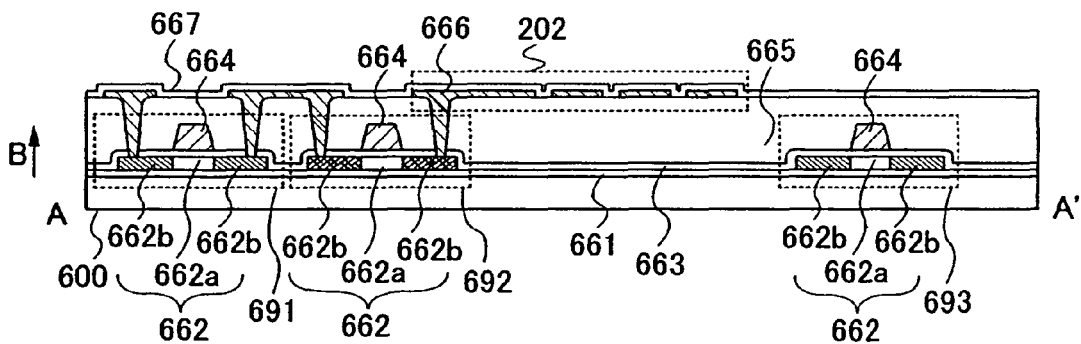
Figure 1C:
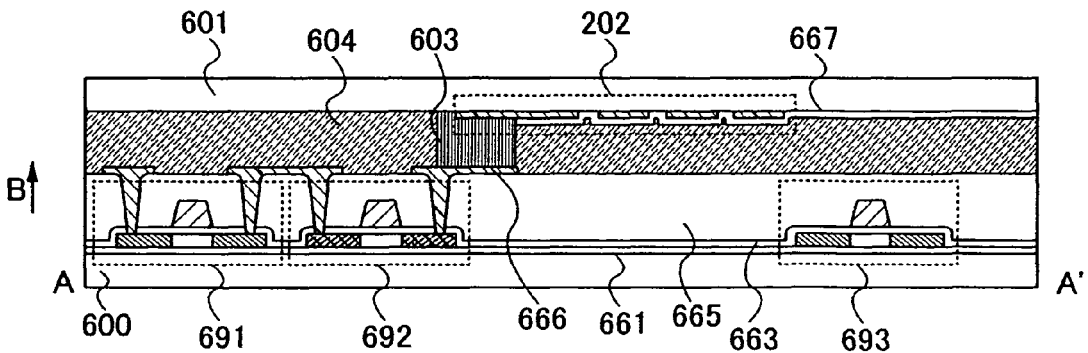

FIGS. 1B and 1C are cross-sectional views along line A-A' of FIG. 1A. In FIG. 1B, a transistor (at least a channel forming region of the transistor) is not overlapped with the antenna.

Note that reference symbol B in FIGS. 1B and 1C denotes a direction of the central axis of the coil. FIG. 1B shows a structure in which the coiled antenna 202 and the semiconductor integrated circuit 203 are formed over one substrate. FIG. 1C shows a structure in which the coiled antenna 202 and the semiconductor integrated circuit 203 are separately formed over different substrates to be attached to each other. In FIGS. 1B and 1C, the same reference numerals are used for the same portions as in FIG. 1A, and description thereof is omitted.

FIG. 1B shows a substrate 600, a base film 661 formed over the substrate 600, a transistor 691, a transistor 692, a transistor 693, an interlayer insulating film 665, a wiring 666 electrically connected to a source or a drain of the transistor (at least one of the transistor 691, the transistor 692, or the transistor 693), the coiled antenna 202, and a protective film 667 for covering the coiled antenna 202. The transistor 691, the transistor 692, and the transistor 693 each have a semiconductor active layer (also referred to as a semiconductor layer) 662 including a channel forming region 662a and source and drain regions 662b, a gate insulating film 663, and a gate electrode 664 overlapping with the semiconductor active layer 662 with the gate insulating film 663 interposed therebetween. The coiled antenna 202 and the semiconductor integrated circuit 203 are electrically connected to each other through the wiring 666. The terminal 221a, the terminal 221b, the one end 222a, and the other end 222b each correspond to a part of the wiring 666.

On the other hand, in FIG. 1C, the coiled antenna 202 is formed over a substrate 601 which is different from the substrate 600 in which the semiconductor integrated circuit 203 is formed. The substrate 600 and the substrate 601 are attached to each other with an adhesive agent 604. The coiled antenna 202 is electrically connected to the wiring 666 with a conductive material 603. In this manner, the coiled antenna 202 and the semiconductor integrated circuit 203 are electrically connected to each other. The terminal 221a and the terminal 221b each correspond to the part of the wiring 666. The one end 222a and the other end 222b each correspond to a part of the coiled antenna 202. An anisotropic conductive film or the like can be used for the conductive material 603. The other structures are the same as that of FIG. 1B; therefore, description thereof is omitted.

Note that the cross-sectional structure taken along line A-A' of FIG. 1A may be different from the structures shown in FIGS. 1B and 1C. Some examples are shown in FIGS. 9A, 9B, 10A to 10D.

Figure 9A:
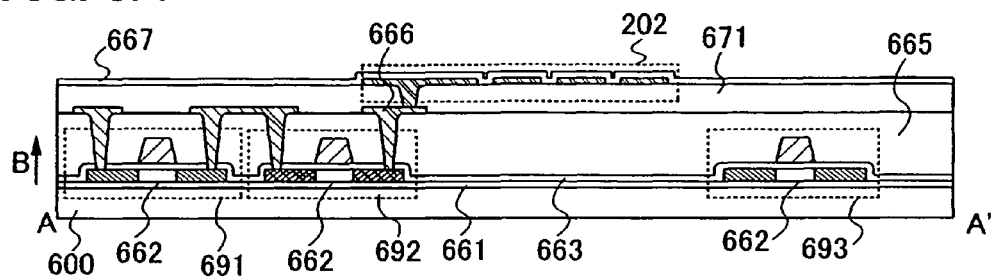
FIGS. 9A and 9B each show a structure of a semiconductor device of Embodiment Mode 1.

FIG. 9A is different from FIG. 1B in that an interlayer insulating film 671 is added. In FIG. 9A, the coiled antenna 202 is connected to the wiring 666 through a contact hole formed in the interlayer insulating film 671. The other structures are the same as that of FIG. 1B; therefore, description thereof is omitted.

Figure 9B:
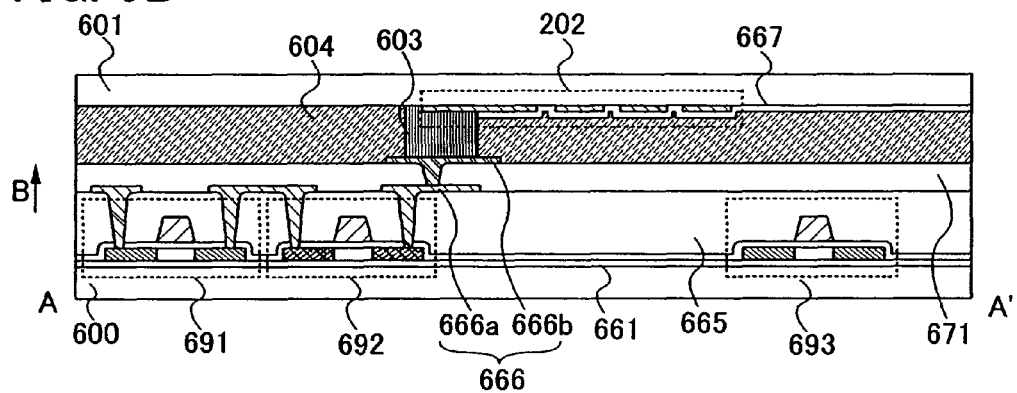

FIG. 9B is different from FIG. 1C in that the interlayer insulating film 671 is added. In FIG. 9B, the wiring 666 of FIG. 1C is formed using a wiring 666a and a wiring 666b. The wiring 666a is electrically connected to a source or a drain of the transistor 692. The wiring 666b is connected to the wiring 666a through a contact hole formed in the interlayer insulating film 671. The wiring 666b is electrically connected to the coiled antenna 202 with the conductive material 603. The other structures are the same as that of FIG. 1C; therefore, description thereof is omitted.

Figure 10A:
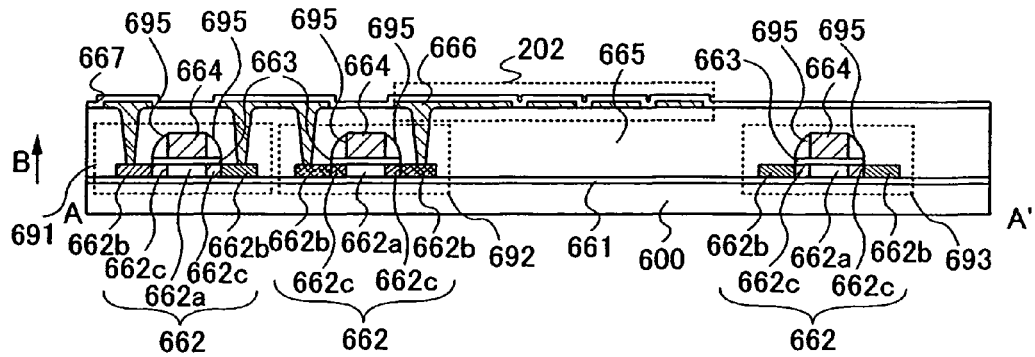
FIGS. 10A to 10D each show a structure of a semiconductor device of Embodiment Mode 1.

FIG. 10A shows an example of a transistor having a different structure from the structure shown in FIG. 1B. In FIG. 10A, the transistors (the transistor 691, the transistor 692, and the transistor 693) each have insulating films 695 (called sidewalls) in contact with side surfaces of the gate electrode 664, and LDD (Lightly Doped Drain) regions. The gate insulating film 663 is formed only in a portion where the gate insulating film 663 overlaps with the gate electrode 664 and the insulating films 695. In each of the transistors, the source and drain regions 662b are formed in a region where the semiconductor active layer 662 does not overlap with the gate electrode 664 and the insulating films 695, and LDD regions 662c are provided in a region where the semiconductor active layer 662 overlaps with the insulating films 695 and does not overlap with the gate electrode 664. The LDD regions 662c include an impurity element imparting a conductivity type at a lower concentration than that of the source and drain regions 662b.

Figure 10B:
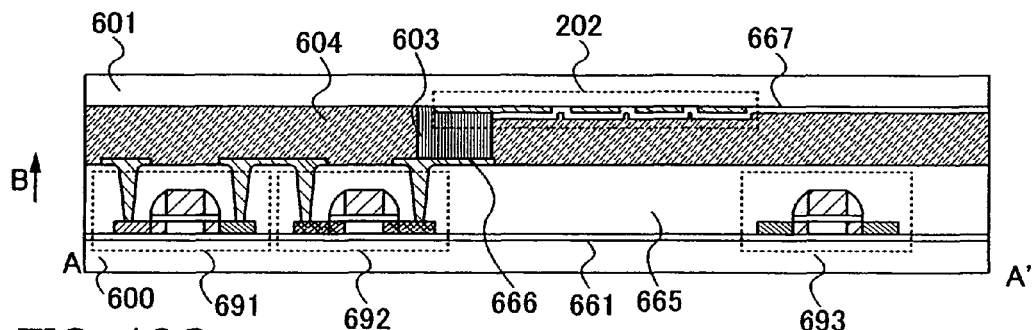

FIG. 10B shows an example of a transistor having a different structure from the structure shown in FIG. 1C. The structure of the transistor is the same as that in FIG. 10A; therefore description thereof is omitted.

Figure 10C:
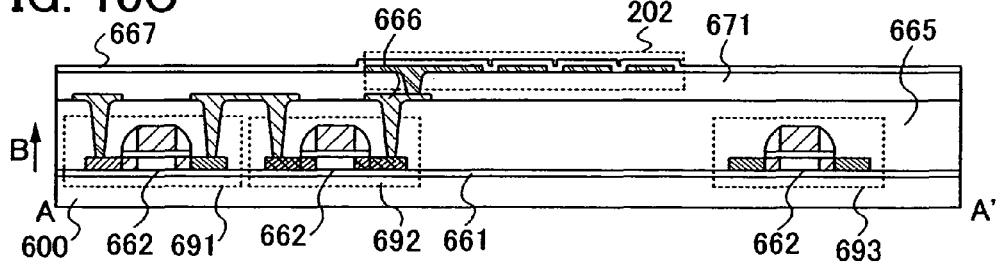

FIG. 10C shows an example of a transistor having a different structure from the structure shown in FIG. 9A. The structure of the transistor is the same as that in FIG. 10A; therefore description thereof is omitted.

Figure 10D:
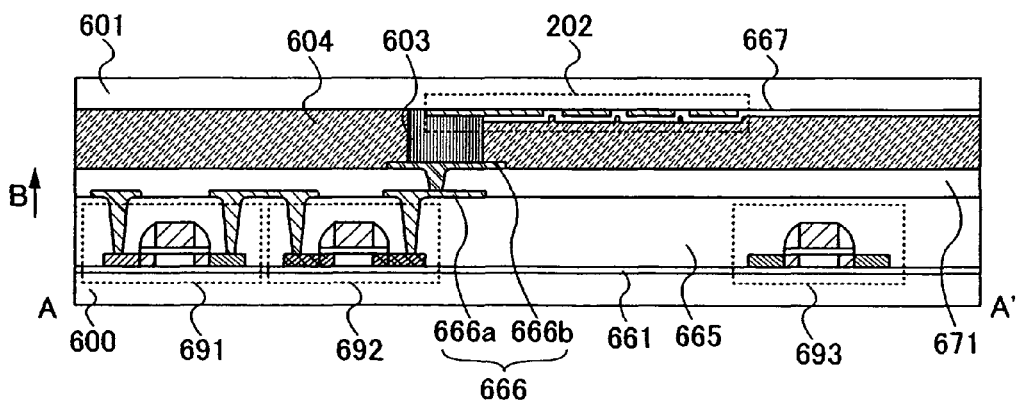

FIG. 10D shows an example of a transistor having a different structure from the structure shown in FIG. 9B. The structure of the transistor is the same as that in FIG. 10A; therefore description thereof is omitted.

Note that in FIGS. 10A to 10D, although the structure in which the LDD regions are provided in all the transistors (the transistor 691, the transistor 692, and the transistor 693) included in the semiconductor integrated circuit 203 is used, the present invention is not limited to this. The semiconductor integrated circuit 203 may have transistors such that only an N-channel transistor is provided with an LDD region and a P-channel transistor is not required to be provided with an LDD region.

In FIGS. 1B, 1C, 9A, 9B, and 10A to 10D, channel forming regions of the transistors (the transistor 691, the transistor 692, and the transistor 693) which form the semiconductor integrate circuit 203 are not included in a region where the coiled antenna 202 and the semiconductor integrated circuit 203 overlap with each other. Thus, when the coiled antenna communicates, a direct effect on a transistor by noise on a signal or the like or variation of electromotive force generated by electromagnetic induction or the like can be suppressed and a risk of malfunction of the semiconductor integrated circuit can be reduced.

In FIGS. 1B, 1C, 9A, 9B, and 10A to 10D, although the transistor is shown as an element which forms the semiconductor integrated circuit 203, a semiconductor integrated circuit of a semiconductor device of the present invention may have an element (a capacitor, a resistor, a diode, or the like) other than that. In addition, in FIGS. 1B, 1C, 9A, 9B, and 10A to 10D, the thin film transistors are shown as the transistor included in the semiconductor integrated circuit 203; however, the present invention is not limited to this. The transistor included in the semiconductor integrated circuit of the semiconductor device of the present invention may be a transistor formed by using a single crystal semiconductor substrate.

Figure 4:
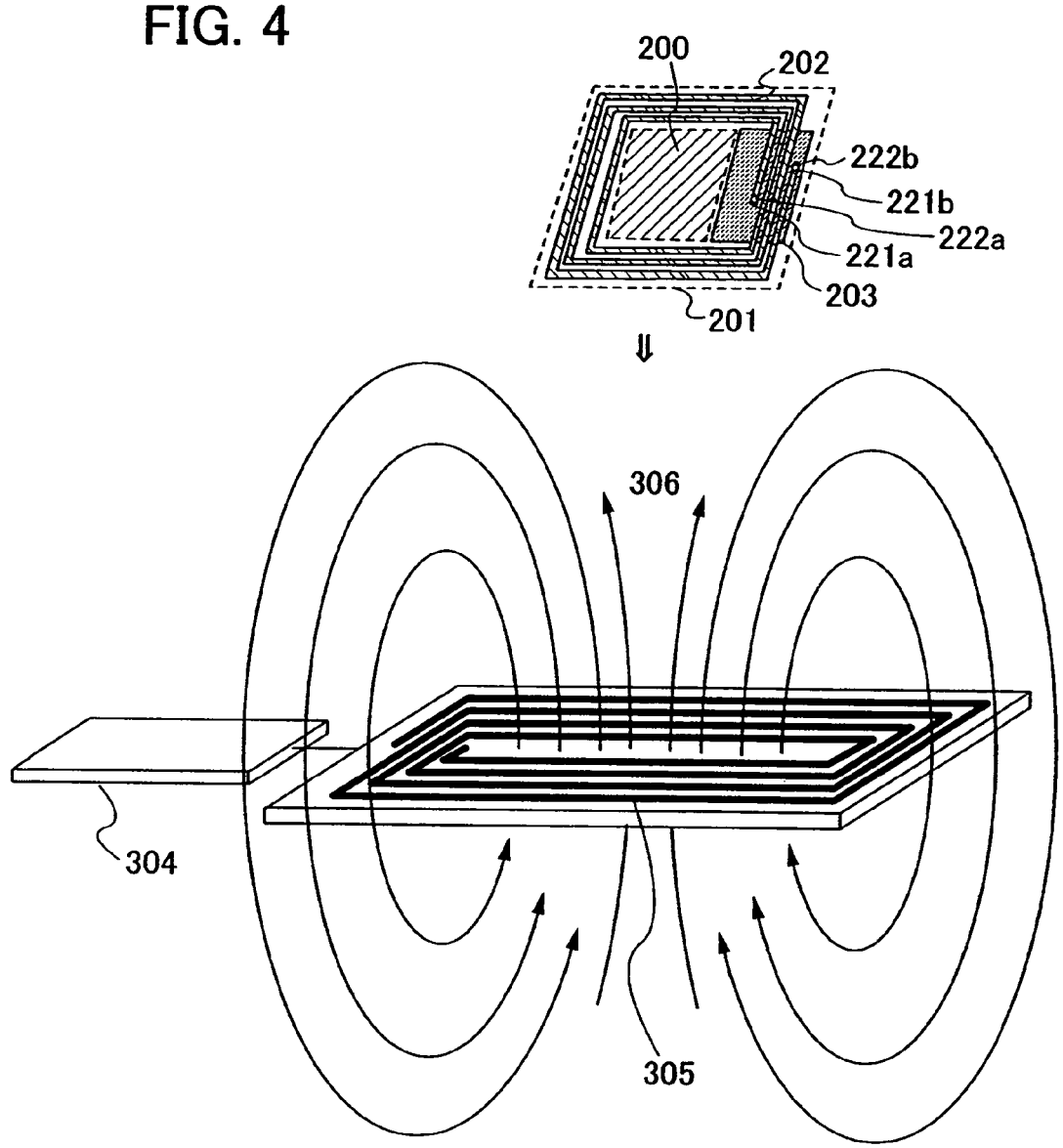
FIG. 4 shows operation of a semiconductor device.

Next, operation of a semiconductor device of the present invention which communicates data by wireless communication is described with reference to FIG. 4. FIG. 4 shows a wireless communication system of the present invention, including the semiconductor device 201, a coiled antenna 305 which communicates data with the semiconductor device 201, and a reader/writer 304 which is electrically connected to the coiled antenna 305.

The semiconductor device 201 is brought close to the coiled antenna 305 (as shown by a thick arrow in FIG. 4). When the semiconductor device 201 is brought close to the coiled antenna 305, an AC magnetic field 306 generated from the coiled antenna 305 passes through the coiled antenna 202 in the semiconductor device 201. It is preferable that ratio of the region 200 is one third or more of an area inside of the coiled antenna 305. More preferably, ratio of the region 200 is one half or more of the area inside of the coiled antenna 305. Then, electromotive force is generated between the terminals (between the one end 222a and the other end 222b) of the coiled antenna 202 in the semiconductor device 201 by electromagnetic induction. The semiconductor integrated circuit 203 in the semiconductor device 201 is operated by electromotive force.

In the semiconductor device 201 of the present invention, by increasing an area of a region 200, the AC magnetic filed 306 generated from the coiled antenna 305 connected to the reader/writer 304 increases a magnetic flux which passes through the coiled antenna 202 in the semiconductor device 201. In this manner, electromotive force generated by electromagnetic induction can be increased. Therefore, sensitivity of the antenna can be improved and a communication distance can be improved.

Note that in FIG. 1A, the square coiled antenna having three windings is shown; however, an antenna of the present invention is not limited to this. A coiled antenna having one winding (a loop antenna) may be used as well. Alternatively, a spiral antenna may be used as well. In addition, these coiled antennas may have a shape which is a circular shape, a square shape, a triangular shape, a polygon shape, or the like when viewed from a direction parallel to a central axis of the coil. Note that FIG. 1A shows a structure in which all of corners of the coiled antenna are about 90°; however, the present invention is not limited to this. A corner of a coiled antenna may have a rounded shape. Alternatively, the corner of the coiled antenna shown in FIG. 1A may have a chamfered shape.

Figure 8A:
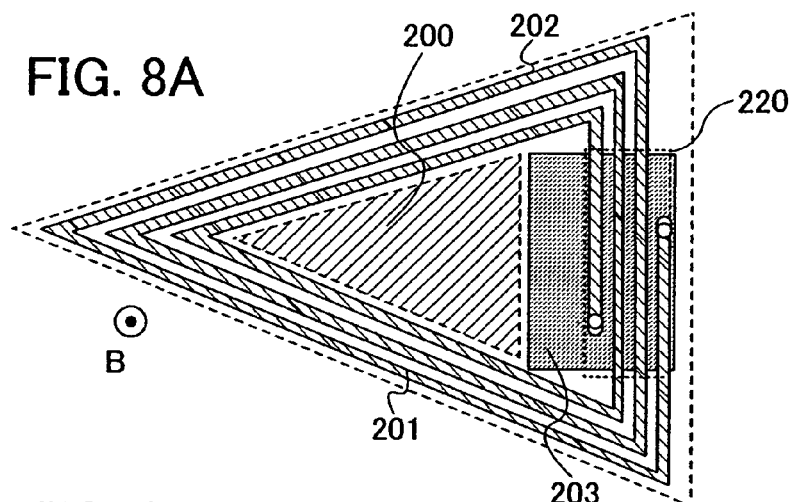
FIGS. 8A to 8C each show a structure of a semiconductor device of Embodiment Mode 1.
Figure 8B:
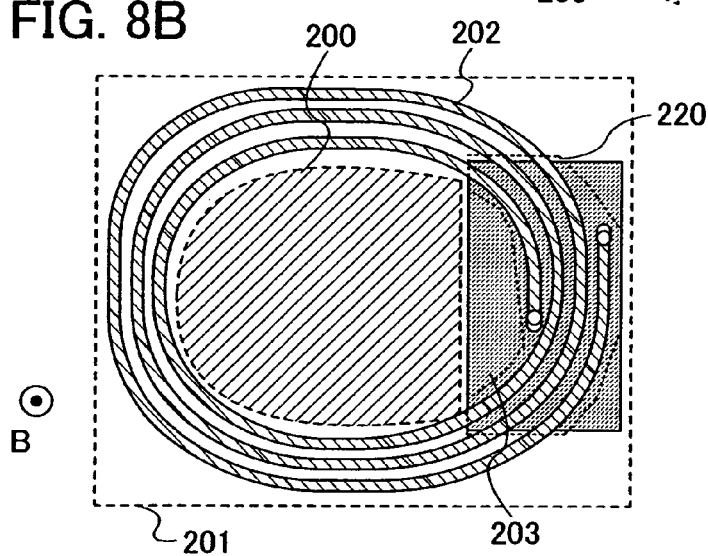
Figure 8C:
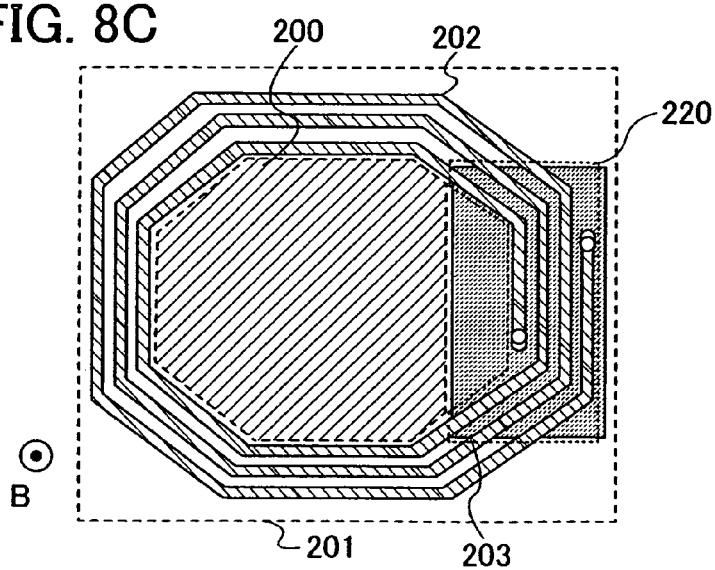

FIGS. 8A to 8C show examples of a semiconductor device of the present invention including a triangular coiled antenna, a circular coiled antenna, and a polygonal coiled antenna, respectively. Note that in FIGS. 8A to 8C, the same reference numerals are used for the same portions as in FIG. 1A, and description thereof is omitted. FIG. 8A shows a structure of the case where the coiled antenna 202 has a triangular shape. FIG. 8B shows a structure of the case where the coiled antenna 202 has a circular shape. FIG. 8C shows a structure of the case where the coiled antenna 202 has a polygonal shape. Note that in FIG. 8C, an octagonal coiled antenna 202 is shown as an example of the polygonal coiled antenna.

A radio signal received by the coiled antenna 202 in the semiconductor device 201 of the present invention is a signal that is obtained by modulating a carrier wave. A carrier wave is modulated by analog modulation or digital modulation, for which any of amplitude modulation, phase modulation, frequency modulation, and spread spectrum may be employed. It is desirable that the amplitude modulation or the frequency modulation be used.

The frequency of a carrier wave may employ any of a sub-millimeter wave of 300 GHz or more and 3 THz or less, an extremely-high-frequency wave of 30 GHz or more and less than 300 GHz, a micro wave of more than 3 GHz and less than 30 GHz, an ultra-high-frequency wave of 300 MHz or more and less than 3 GHz, a very-high-frequency wave of 30 MHz or more and less than 300 MHz, a high-frequency wave of 3 MHz or more and less than 30 MHz, a medium-frequency wave of 300 KHz or more and less than 3 MHz, a long-frequency wave of 30 KHz or more and less than 300 kHz, and a very-long frequency wave of 3 KHz or more and less than 30 KHz. It is desirable that the frequency of a carrier wave be 1 GHz or less.

Furthermore, power source voltage of the semiconductor device 201 of the present invention may be 1 V to 6 V, and desirably 3 V or less.

A semiconductor device of the present invention having the aforementioned configuration which communicates data by wireless communication can improve sensitivity of an antenna, the momentary variation of electromotive force due to noise or the like can be mitigated, and the semiconductor integrated circuit can be easily operated.

Embodiment Mode 2

In Embodiment Mode 2, a structure in which a capacitor is arranged in the region where the coiled antenna 202 and the semiconductor integrated circuit 203 overlap with each other in the semiconductor device 201 shown in FIG. 1A described in Embodiment Mode 1 is described. Description is made with reference to FIGS. 3A to 3E, and 11A to 13 B. Note that in FIGS. 3A to 3E, and 11A to 13 B, the same reference numerals are used for the same portions as in FIGS. 1A to 1C.

FIGS. 3A to 3C, and 12A to 12C each show a structure in which the coiled antenna 202 and the semiconductor integrated circuit 203 are formed over one substrate.

FIG. 3A shows a structure in which a capacitor 401 which forms the semiconductor integrated circuit 203 is provided so as to overlap with the coiled antenna 202. Note that in FIGS. 3A to 3E, the same reference numerals are used for the same portions as in FIGS. 1A to 1C, and description thereof is omitted. FIG. 3A shows a structure in which a semiconductor layer 681 etched at the same time as the semiconductor active layer 662 of the transistors (the transistors 691 to 693) of the semiconductor integrated circuit 203 is used as one electrode of the capacitor 401. In addition, shown is a structure in which a conductive layer 682 etched at the same time as the gate electrodes 664 of the transistors (the transistors 691 to 693) is used as the other electrode of the capacitor 401. A dielectric layer of the capacitor 401 is the gate insulating film 663. Note that an impurity element imparting a conductivity type may be added to an entire surface or a part of the semiconductor layer 681.

FIG. 3B shows a structure in which a capacitor 402 is provided so as to overlap with the coiled antenna 202. The capacitor 402 has a structure in which the coiled antenna 202 is used as one electrode, an electrode or a part of a wiring of the semiconductor integrated circuit 203 is used as the other electrode, and an interlayer insulating film 665 is sandwiched between the one electrode and the other electrode. FIG. 3B shows a structure in which the conductive layer 682 etched at the same time as the gate electrodes 664 of the transistors (the transistors 691 to 693) is used as the other electrode.

Note that in FIG. 3A, a structure in which the coiled antenna 202 is used as one electrode, the conductive layer 682 of the capacitor 401 is used as the other electrode, and the capacitor 402 is provided further may be used as well. Accordingly, the capacitor 401 and the capacitor 402 overlap with each other, so that a capacitor with a large capacitance value can be formed in a small space.

In addition, FIGS. 3A and 3B each show an example in which the wiring 666 electrically connected to the source or drain of the transistors (the transistors 691 to 693), and the coiled antenna 202 are formed over the same insulating surface. At this time, the wiring 666 and the coiled antenna 202 can be formed by etching at the same time.

FIG. 3C shows a structure in which a capacitor 403 is provided so as to overlap with the coiled antenna 202. The capacitor 403 has a structure in which the coiled antenna 202 is used as one electrode, an electrode or a part of a wiring of the semiconductor integrated circuit 203 is used as the other electrode, and an insulating film is sandwiched between the one electrode and the other electrode. FIG. 3C shows a structure in which a conductive layer 683 etched at the same time as the wiring 666 is used as the other electrode. The interlayer insulating film 671 is formed between the wiring 666 and the coiled antenna 202. A dielectric layer of the capacitor 403 is the interlayer insulating film 671.

Figure 12A:
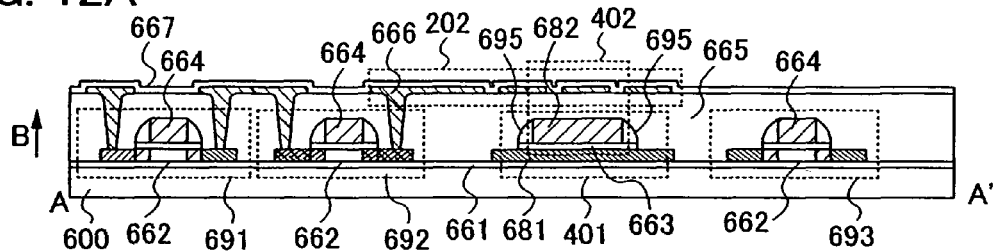
FIGS. 12A to 12E each show a structure of a semiconductor device of Embodiment Mode 2.

FIG. 12A shows an example of combining the structure of the transistors including LDD regions shown in FIG. 10A and the structure of the capacitor 401 and the capacitor 402 shown in FIG. 3A. The insulating films 695 (the sidewalls) are provided on the side surfaces of the conductive layer 682. The same reference numerals are used for the same portions as in FIGS. 10A and 3A, and description thereof is omitted.

Figure 12B:
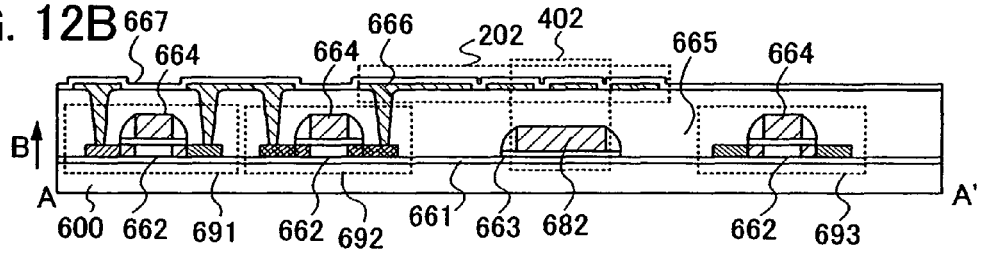

FIG. 12B shows an example of combining the structure of the transistors including the LDD regions shown in FIG. 10A and the structure of the capacitor 402 shown in FIG. 3B. The insulating films 695 (the sidewalls) are provided on the side surfaces of the conductive layer 682. The same reference numerals are used for the same portions as in FIGS. 10A and 3B, and description thereof is omitted.

Figure 12C:
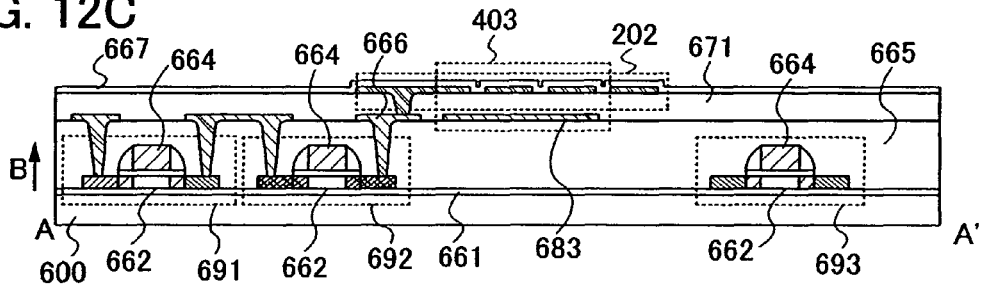

FIG. 12C shows an example of combining the structure of the transistors including the LDD regions shown in FIG. 10C and the structure of the capacitor 403 shown in FIG. 3C. The same reference numerals are used for the same portions as in FIGS. 10C and 3C, and description thereof is omitted.

FIGS. 3D, 3E, 11A, 11B, 12D, 12E, 13A, and 13B each show a structure in which the coiled antenna 202 is formed over the substrate 601, the semiconductor integrated circuit 203 is formed over the substrate 600, and the substrate 600 and the substrate 601 are attached with the adhesive agent 604.

FIG. 3D shows a structure in which the capacitor 401 which forms the semiconductor integrated circuit 203 is provided so as to overlap with the coiled antenna 202 similarly to FIG. 3A.

FIG. 3E shows a structure in which the capacitor 403 is formed so as to overlap with the coiled antenna 202 similarly to FIG. 3C. The dielectric layer of the capacitor 403 is the interlayer insulating film 671 in the structure shown in FIG. 3C; however, a dielectric layer of capacitor 403 is the adhesive agent 604 in the structure shown in FIG. 3E.

Figure 11A:
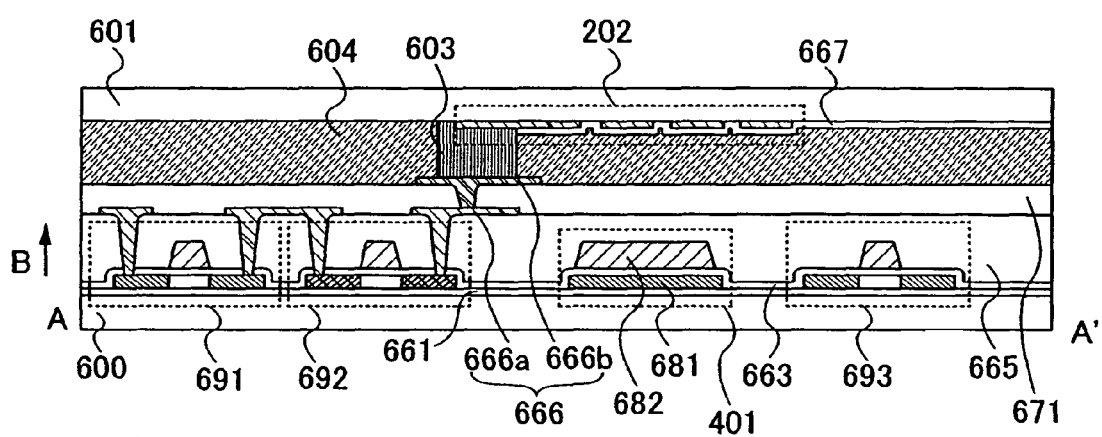
FIGS. 11A and 11B each show a structure of a semiconductor device of Embodiment Mode 2.

FIG. 11A shows an example of combining the structure including the interlayer insulating film 671 shown in FIG. 9B and the structure of the capacitor 401 shown in FIG. 3A. The same reference numerals are used for the same portions as in FIGS. 9B and 3A, and description thereof is omitted.

Figure 11B:
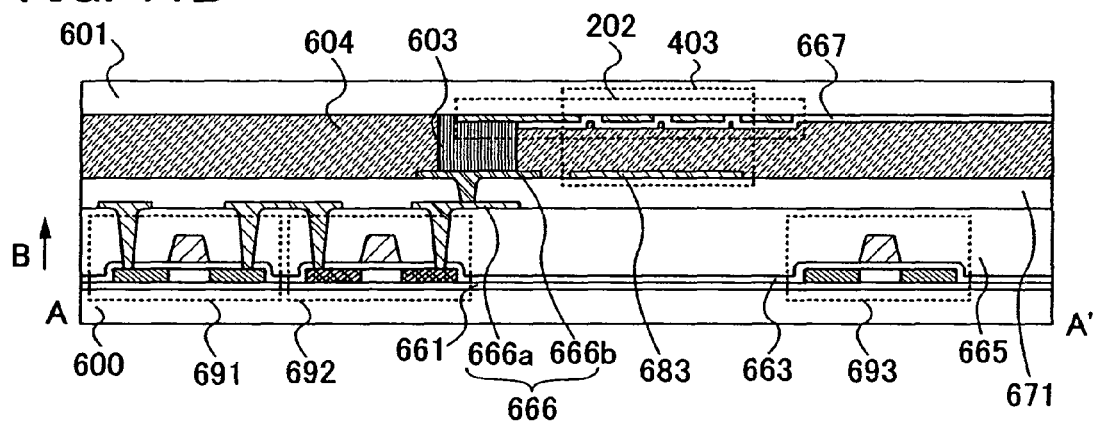

FIG. 11B shows an example of combining the structure including the interlayer insulating film 671 shown in FIG. 9B and the structure of the capacitor 403 shown in FIG. 3C. The same reference numerals are used for the same portions as in FIGS. 9B and 3C, and description thereof is omitted.

Figure 12D:
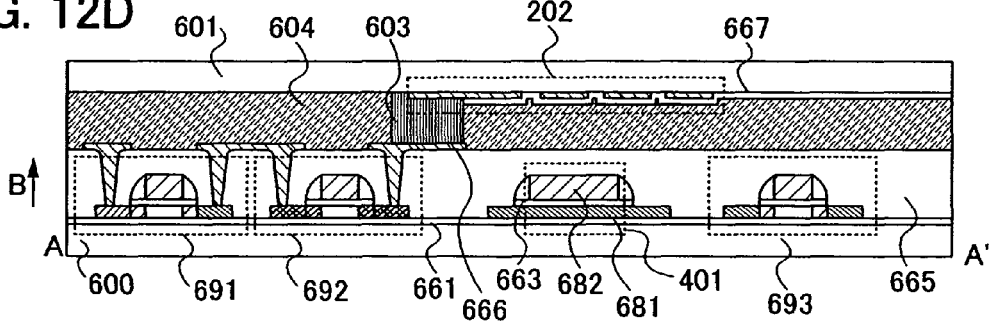

FIG. 12D shows an example of combining the structure of the transistors including the LDD regions shown in FIG. 10B and the structure of the capacitor 401 shown in FIG. 3D. The insulating films 695 (the sidewalls) are provided on the side surfaces of the conductive layer 682. The same reference numerals are used for the same portions as in FIGS. 10B and 3D, and description thereof is omitted.

Figure 12E:
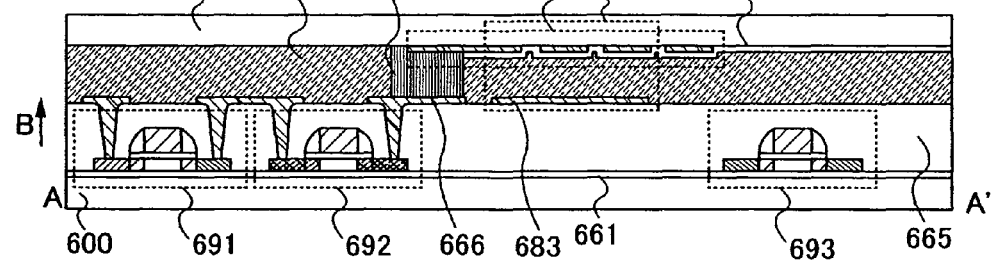

FIG. 12E shows an example of combining the structure of the transistors including the LDD regions shown in FIG. 10B and the structure of the capacitor 403 shown in FIG. 3E. The same reference numerals are used for the same portions as in FIGS. 10B and 3E, and description thereof is omitted.

Figure 13A:
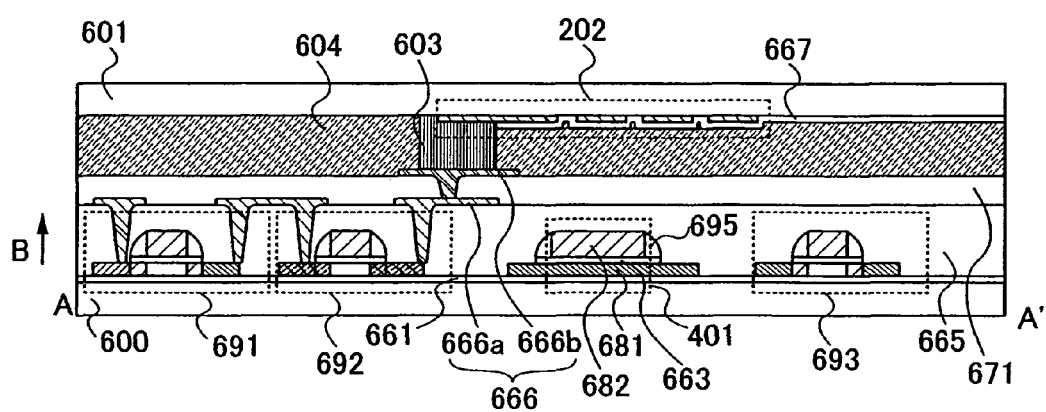
FIGS. 13A and 13B each show a structure of a semiconductor device of Embodiment Mode 2.

FIG. 13A shows an example of combining the structure of the transistors including the LDD regions shown in FIG. 10D and the structure of the capacitor 401 shown in FIG. 3D. The insulating films 695 (the sidewalls) are provided on the side surfaces of the conductive layer 682. The same reference numerals are used for the same portions as in FIGS. 10D and 3D, and description thereof is omitted.

Figure 13B:
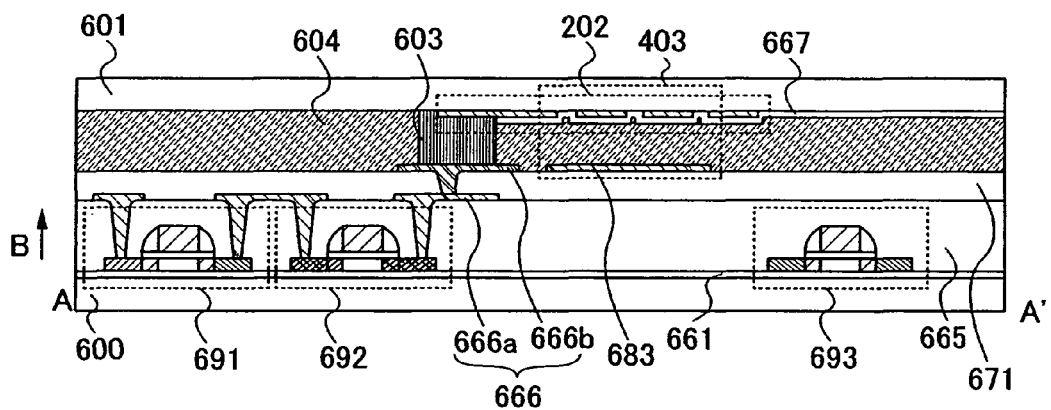

FIG. 13B shows an example of combining the structure of the transistors including the LDD regions shown in FIG. 10D and the structure of the capacitor 403 shown in FIG. 3E. The same reference numerals are used for the same portions as in FIGS. 10D and 3E, and description thereof is omitted.

Note that a part of a wiring in the semiconductor integrated circuit 203, in which a predetermined potential is held may be the other electrode of the capacitor 402 or the capacitor 403 (the conductive layer 682 or the conductive layer 683). The wiring in which the predetermined potential is held may be a power source line of the semiconductor integrated circuit 203. Note that the potential of the power source line is kept at a predetermined level when a radio signal is supplied to the semiconductor device. In this manner, without increasing the number of wirings, a capacitor can be formed in the region where the semiconductor integrated circuit 203 and the coiled antenna 202 overlap with each other.

As in this embodiment mode, by providing the capacitors (the capacitors 401 to 403) so as to overlap with the coiled antenna 202, an absolute value of change in the potential due to variation of electromotive force caused by noise or the like can be suppressed. That is, the momentary variation of electromotive force due to noise or the like can be mitigated, and the semiconductor integrated circuit 203 can be easily operated.

In particular, in the structures shown in FIGS. 3B, 3C, 12B, and 12C, compared to the structures shown in FIGS. 3E, 11B, and 12E, distance between a pair of electrodes of the capacitor 402 or the capacitor 403 can be shortened. Therefore, area of the electrode in the capacitor can be small, and the structures shown in FIGS. 3B, 3C, 12B, and 12C are especially effective in downsizing the semiconductor device 201.

Note that the structures of FIGS. 3A to 3C, and 12A to 12C may be combined or the structures of FIGS. 3D, 3E, 11A, 11B, 12D, 12E, 13A, and 13B may be combined.

Each capacitor (the capacitor 401, the capacitor 402, or the capacitor 403) provided so as to overlap with the coiled antenna 202 can be used as a capacitor below. For example, each capacitor can be used as a capacitor (called a storage capacitor) for rectifying and smoothing electromotive force generated by the coiled antenna 202, and holding electromotive force as power source voltage of the semiconductor integrated circuit 203. In addition, each capacitor can be used as a capacitor (called a resonant capacitor) which forms a resonant circuit, which resonates with a frequency of an alternating current signal transmitted from the antenna connected to a reader/writer, with the coiled antenna 202 in the semiconductor device 201. In the case of using the capacitor as a storage capacitor or a resonant capacitor, the size of the semiconductor integrated circuit 203 in the semiconductor device 201 can be reduced, and the region 200 (see FIG. 1A) can be enlarged further; therefore, there are advantages in that sensitivity of an antenna is further improved, a communication distance is further improved, or the like.

Note that each capacitor (the capacitor 401, the capacitor 402, or the capacitor 403) which is provided so as to overlap with the coiled antenna 202 can be used as a capacitor of the semiconductor device 201 as necessary.

A semiconductor device of the present invention having the aforementioned configuration which communicates data by wireless communication can improve sensitivity of an antenna, the momentary variation of electromotive force due to noise or the like can be mitigated, and the semiconductor integrated circuit can be easily operated without increasing the size of the device.

Embodiment Mode 2 can be freely combined with Embodiment Mode 1.

Embodiment Mode 3

Embodiment Mode 3 describes a structural example of a region where the coiled antenna 202 and the semiconductor integrated circuit 203 overlap with each other, which is different from the structure shown in Embodiment Mode 1.

Embodiment Mode 1 describes a structure in which a transistor which forms the semiconductor integrated circuit 203 is not included in the region where the coiled antenna 202 and the semiconductor integrated circuit 203 overlap with each other. However, the transistor which forms the semiconductor integrated circuit 203 may be arranged in the region where the coiled antenna 202 overlaps with the semiconductor integrated circuit 203. In that case, a digital circuit desirably overlaps with the coiled antenna 202. This is because the digital circuit is less affected by on momentary variation of electromotive force due to noise or the like than an analog circuit.

Figure 5:
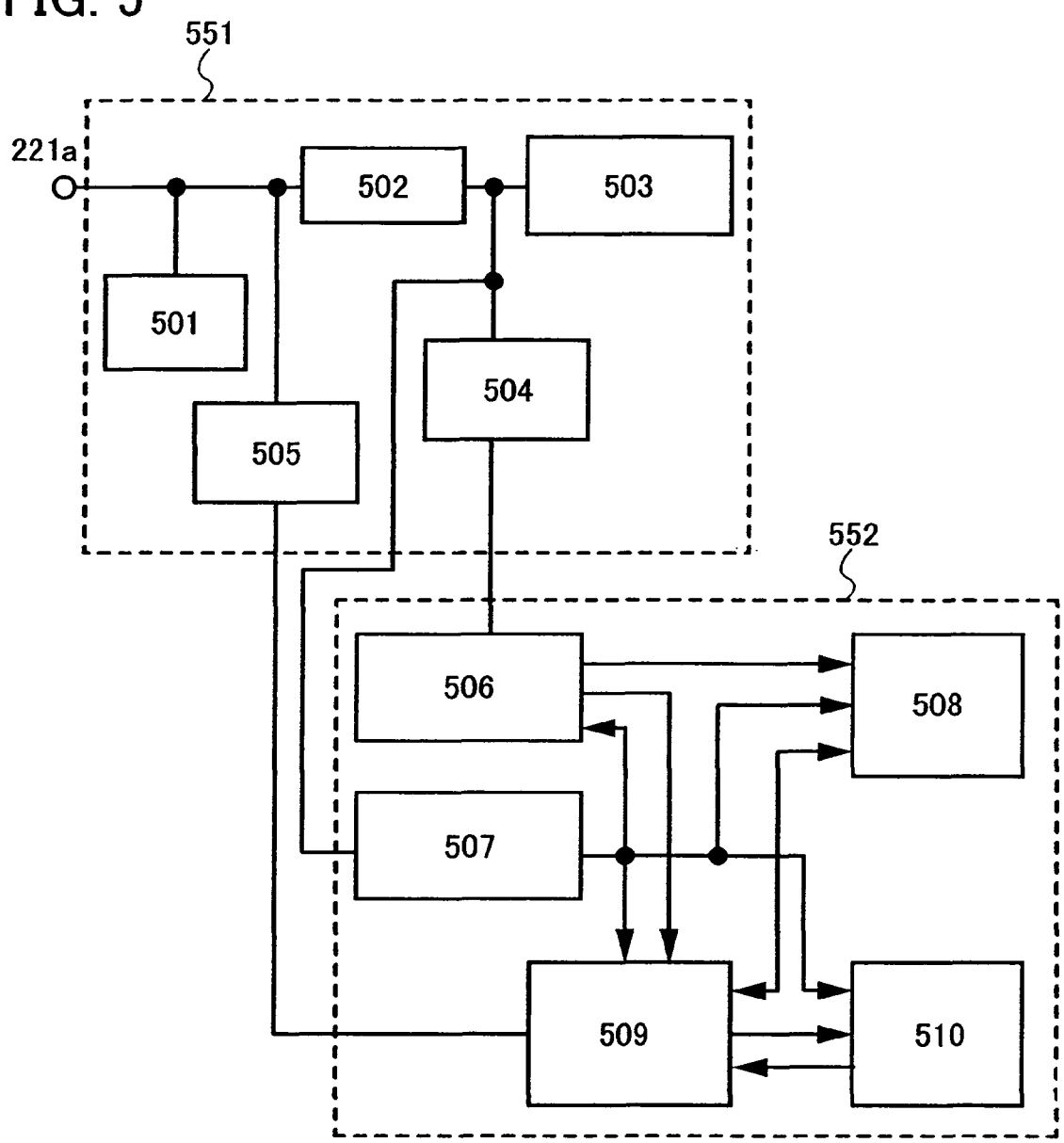
FIG. 5 shows a structure of a semiconductor device of Embodiment Mode 3.

FIG. 5 is a block diagram showing a structural example of a semiconductor integrated circuit. In FIG. 5, the same reference numerals are used for the same portions as in FIG. 1A. The semiconductor integrated circuit includes an analog circuit 551 and a digital circuit 552. The analog circuit 551 includes a resonant capacitor 501, a band-pass filter 502, a power supply circuit 503, a demodulation circuit 504, a modulation circuit 505, and the like. The digital circuit includes a code extraction circuit 506, a clock generation circuit 507, a cyclic redundancy check circuit 508, a control circuit 509, a memory circuit 510, and the like. In FIG. 5, only the terminal 221a is shown as a terminal electrically connected to the coiled antenna 202. The other terminal 221b is connected to a wiring common to each circuit, and holds a predetermined potential (for example, a ground potential). Note that the potential of the wiring common to each circuit is kept at a predetermined level when a radio signal is supplied to a semiconductor device.

The case where the semiconductor device receives data is described. A radio signal (a modulated carrier wave) inputted from the coiled antenna 202 is inputted from the terminal 221a to the analog circuit 551. A desired frequency component is extracted from the inputted radio signal by the band-pass filter 502 and is inputted to the power supply circuit 503 and the demodulation circuit 504. The power supply circuit 503 includes a rectifier circuit and a storage capacitor. The modulated carrier wave which is inputted through the band-pass filter 502 is rectified by the rectifier circuit and smoothed using storage capacitor. Thus, the power supply circuit 503 generates a direct current voltage. The direct current voltage generated in the power supply circuit 503 is supplied as power source voltage to each circuit in the semiconductor integrated circuit 203. The modulated carrier wave which is inputted through the band-pass filter 502 is inputted to the clock generation circuit 507 in the digital circuit 552. A clock generated in the clock generation circuit 507 is supplied to each circuit. The modulated carrier wave which is inputted through the band-pass filter 502 is demodulated by the demodulation circuit 504 and the demodulated signal is inputted to the digital circuit 552. The signal which is made by demodulating the modulated carrier wave using the demodulation circuit 504 is inputted to the code extraction circuit 506 and a code of the signal is extracted. An output of the code extraction circuit 506 is inputted to the control circuit 509 and a code is extracted. The extracted code is inputted to the cyclic redundancy check circuit 508 and an arithmetic processing for identifying a transmission error is performed. In this manner, the cyclic redundancy check circuit 508 outputs to the control circuit 509 whether a received data has an error.

Next, the case where the semiconductor device transmits data is described. The memory circuit 510 outputs a stored unique identifier (UID) to the control circuit 509, in response to a signal inputted from the control circuit 509. The cyclic redundancy check circuit 508 calculates a CRC code corresponding to transmitted data and outputs the CRC code to the control circuit 509. The control circuit 509 adds the CRC code to the transmitted data. In addition, the control circuit 509 encodes the transmitted data to which the CRC code is added. Further, the control circuit 509 converts encoded information into a signal for modulating a carrier wave in response to a predetermined modulation method. The output of the control circuit 509 is inputted to the modulation circuit 505 of the analog circuit 551. The modulation circuit 505 load-modulates the carrier wave in response to the inputted signal and outputs the carrier wave to the coiled antenna 202.

As for a semiconductor device of the present invention, the coiled antenna 202 desirably overlaps with the digital circuit 552 instead of the analog circuit 551. However, in the case of the digital circuit 552, the memory circuit 510 for storing a unique identifier (UID) of the semiconductor device or the like easily receives momentary variation of electromotive force due to noise or the like; therefore, the memory circuit 510 is desirably arranged so as not to overlap with the coiled antenna 202.

This embodiment mode can be freely combined with Embodiment Mode 1 or 2.

Embodiment Mode 4

In this embodiment mode, layout of the semiconductor integrated circuit 203 of the semiconductor device 201 of the present invention is described with reference to FIG. 6.

Figure 6:
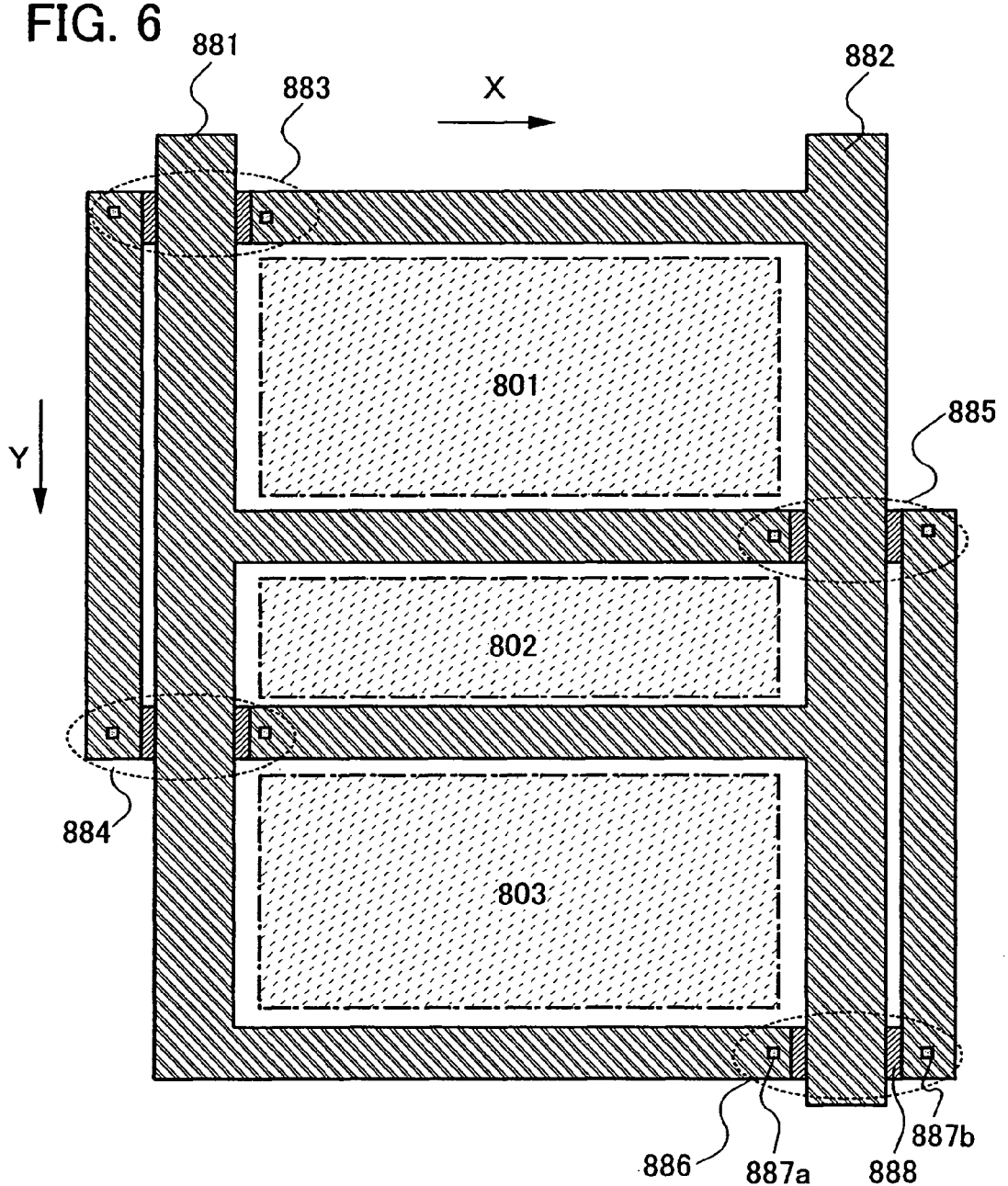
FIG. 6 shows a structure of a semiconductor integrated circuit of Embodiment Mode 4.

In FIG. 6, the semiconductor integrated circuit 203 includes a pair of power source lines (a first power source line 881 and a second power source line 882) which supplies power source voltage to each element of the circuit. A potential difference between a potential supplied to the first power source line 881 and a potential supplied to the second power source line 882 is power source voltage.

The first power source line 881 and the second power source line 882 are provided over the same insulating surface. A structure of intersection portions (an intersection portion 883, an intersection portion 884, an intersection portion 885, and an intersection portion 886) of the first power source line 881 and the second power source line 882 is described using the intersection portion 886 as an example. The intersection portion is provided with a wiring 888. The wiring 888 is provided over an insulating surface which is different from the insulating surface where the first power source line 881 and the second power source line 882 are provided. The second power source line 882 is led using the wiring 888, a contact hole 887a and a contact hole 887b which connect the wiring 888 and the second power source line 882.

An element included in the semiconductor integrated circuit 203 is arranged in regions (a region 801, a region 802, and a region 803) surrounded by the first power source line 881 and the second power source line 882. Accordingly, the semiconductor integrated circuit 203 can be shielded from noise outside the circuit or the like and reliability of the semiconductor integrated circuit can be enhanced.

As shown in Embodiment Mode 2 described above, in the structure in which the capacitor is arranged in the region where the semiconductor integrated circuit and the coiled antenna overlap with each other, a part of a wiring in the semiconductor integrated circuit, in which a predetermined potential is held can be the other electrode of the capacitor. The first power source line 881 or the second power source line 882 shown in this embodiment mode can be used as the wiring in which the predetermined potential is held.

In particular, a wiring which forms a coiled antenna is preferably provided along directions (X and Y in FIG. 6) in which the first power source line 881 and the second power source line 882 are extended. For example, one side of a square coiled antenna, one side of a triangular coiled antenna, or one side of a polygonal coiled antenna may be provided so as to be parallel to the X direction or the Y direction. In this manner, a capacitance value of a capacitor formed using a portion where the first power source line 881 or the second power source line 882 overlaps with the coiled antenna can be increased.

This embodiment mode can be freely combined with Embodiment Modes 1 to 3.

Embodiment Mode 5

In this embodiment mode, an example in which a semiconductor device of the present invention is actually manufactured is described with reference to FIG. 7.

Figure 7:
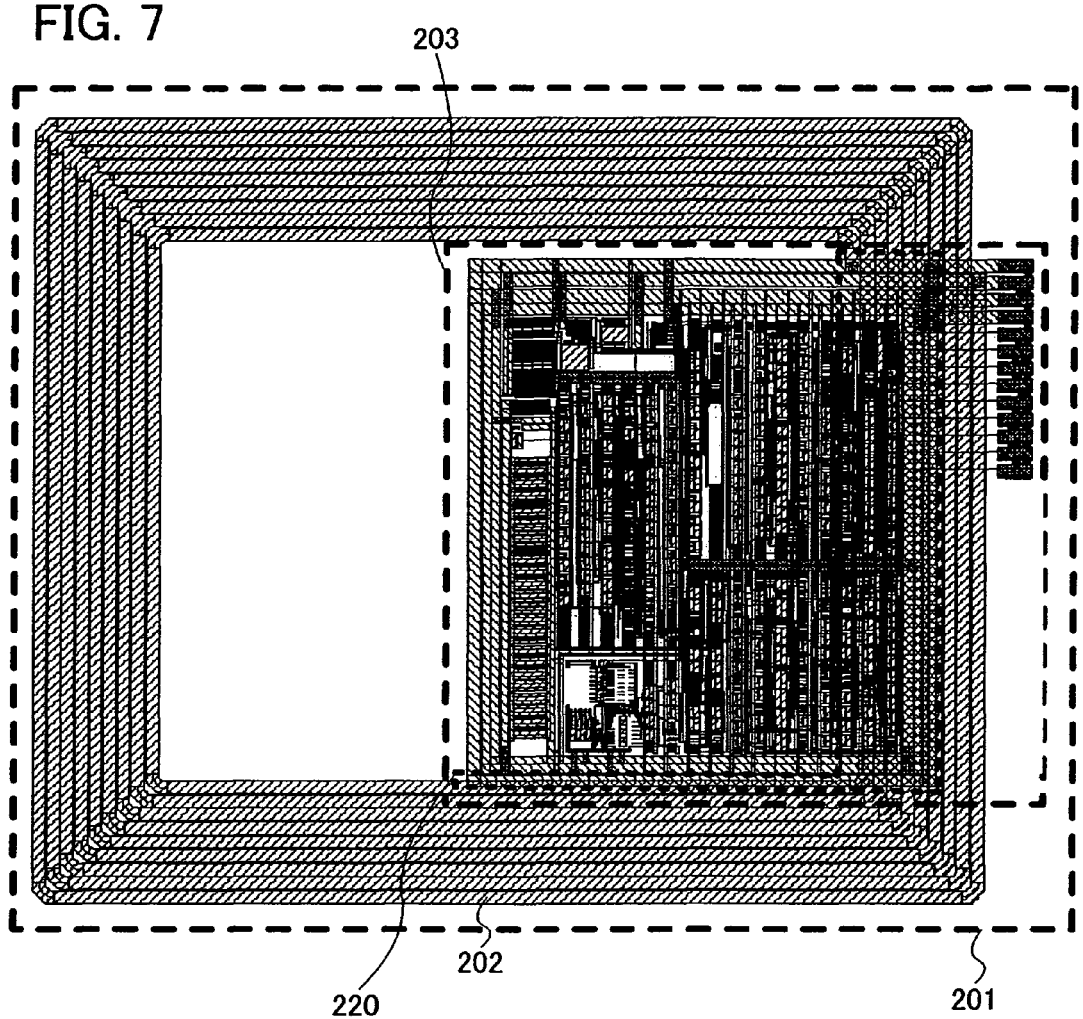
FIG. 7 shows a mask drawing of a semiconductor device of Embodiment Mode 5.

FIG. 7 is a mask diagram of the semiconductor device 201 including the coiled antenna 202. The same reference numerals are used for the same portions as in FIG. 1A, and description thereof is omitted.

In FIG. 7, a cyclic redundancy check circuit in the digital circuit of the semiconductor integrated circuit 203 is arranged so as to overlap with the coiled antenna 202.

This embodiment mode can be freely combined with Embodiment Modes 1 to 4.

Embodiment 1

In this embodiment, applications of a semiconductor device of the present invention which communicates data by wireless communication (hereinafter called an RFID tag) and of a communication system using the semiconductor device are described. The RFID tag of the present invention can be incorporated in, for example, bills, coins, securities, bearer bonds, certificates (driving licenses, resident cards, and the like), containers for wrapping objects (wrapping paper, bottles, and the like), DVD (Digital Versatile Disc) software, CDs (Compact Discs), recording media such as video tapes, vehicles such as cars, motorbikes, and bicycles, personal belongings such as bags and glasses, foods, clothes, commodities, electronic apparatuses, and the like. The electronic apparatuses include a liquid crystal display device, an EL (electroluminescent) display device, a television set (also simply called a television or a television receiver), a mobile phone set, and the like.

The RFID tag of the present invention can be fixed to an object by being attached to the surface of the object or embedded in the object. For example, the RFID tag of the present invention may be embedded in paper of a book, or organic resin of a package. When the RFID tag is incorporated in bills, coins, securities, bearer bonds, certificates, and the like, forgery thereof can be prevented. Furthermore, when the RFID tag is incorporated in containers for wrapping objects, recording media, personal belongings, foods, clothes, commodities, electronic apparatuses, and the like, an inspection system, a rental system, and the like can improve efficiency. The RFID tag can also prevent vehicles from being forged or stolen. In addition, when the RFID tag is implanted into creatures such as animals, individual creatures can be identified easily. For example, when a wireless tag is implanted into creatures such as domestic animals, the year of birth, sex, breed, and the like thereof can be distinguished easily.

As described above, the RFID tag of the present invention can be incorporated in any object (including creatures).

Figure 14A:
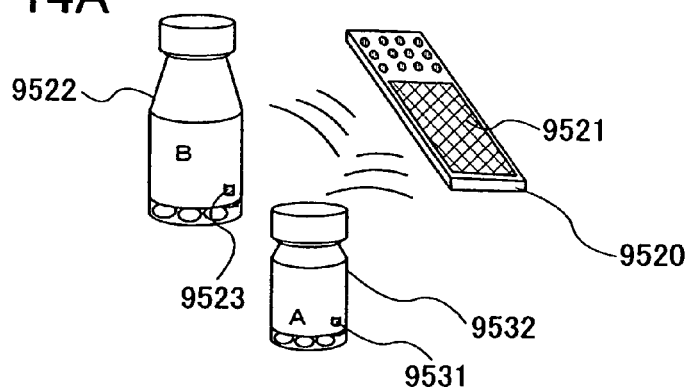
FIGS. 14A to 14C each show a structure of Embodiment 1.

Next, one mode of a system using the RFID tag is described with reference to FIG. 14A. A terminal 9520 including a display portion 9521 is provided with an antenna and a reader/writer connected to the antenna. A semiconductor device 9531 of the present invention is provided on an object A 9532, and a semiconductor device 9523 of the present invention is provided on an object B 9522. In FIG. 14A, an internal medicine is shown as an example of the object A or the object B. When an antenna of the terminal 9520 is brought close to the semiconductor device 9531 included in the object A 9532, information on the object A 9532, such as ingredients, place of origin, test results in each production step, history of the distribution process, and explanation of the object is displayed on the display portion 9521. When the antenna of the terminal 9520 is brought close to the semiconductor device 9523 included in the object B 9522, information on the object B 9522, such as ingredients, place of origin, test result in each production step, history of the distribution process, and explanation of the object is displayed on the display portion 9521.

Figure 14B:
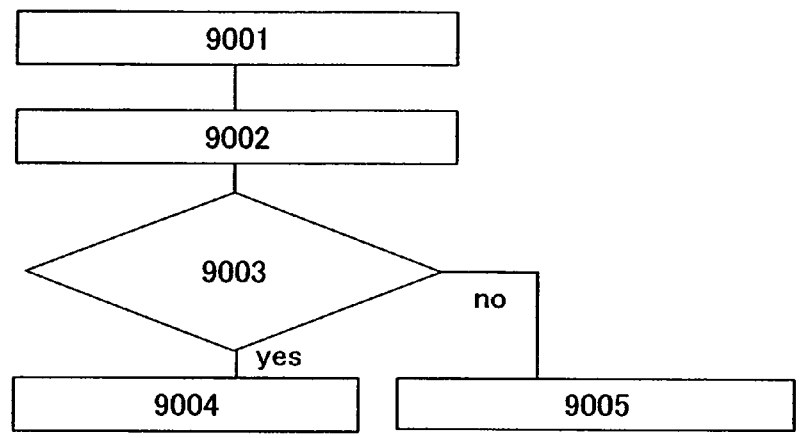

An example of a business model utilizing the system shown in FIG. 14A is described with reference to a flow chart shown in FIG. 14B. Information on allergy is inputted to the terminal 9520 (a first step 9001). The information on allergy is information on medical products, their components, or the like that may cause allergic reactions to certain people. As described above, information of an internal medicine A which is the object A 9532 is obtained by the antenna incorporated in the terminal 9520 (a second step 9002). The information on the internal medicine A includes information on the components and the like of the internal medicine A. The information on allergy is compared to the obtained information on components and the like of the internal medicine A, thereby determining whether corresponding components are contained (a third step 9003). If the corresponding components are contained, the user of the terminal 9520 is alerted that certain people may have allergic reactions to the internal medicine A (a fourth step 9004). If the corresponding components are not contained, the user of the terminal 9520 is informed that certain people are at low risk of having allergic reactions to the internal medicine A (the fact that the internal medicine A is safe) (a fifth step 9005). In the fourth step 9004 and the fifth step 9005, in order to inform the user of the terminal 9520, the information may be displayed on the display portion 9521 of the terminal 9520, or an alarm of the terminal 9520 or the like may be sounded.

Figure 14C:
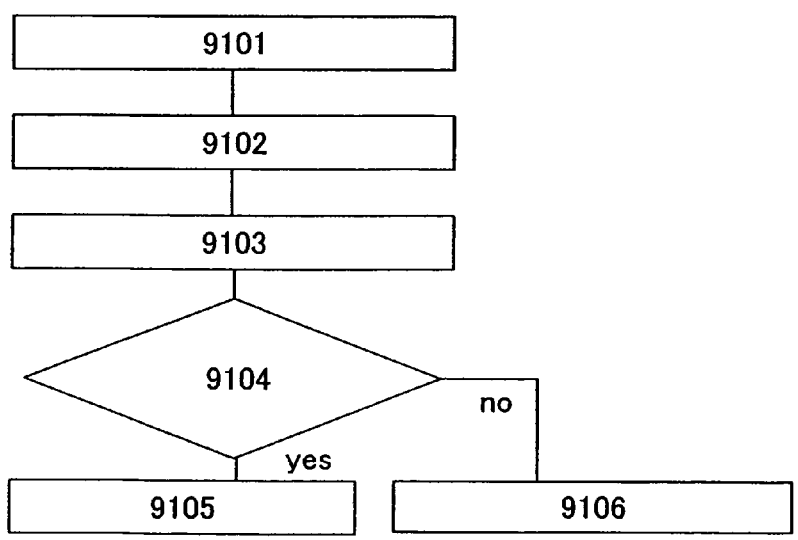

Alternatively, as another example of a business model is shown in FIG. 14C. Information on combinations of internal medicines which are dangerous when used at the same time or combinations of components of internal medicines which are dangerous when used at the same time (hereinafter referred to as combination information) is inputted to the terminal 9520 (a first step 9101). As described above, information of the internal medicine A which is the object A 9532 is obtained by the antenna incorporated in the terminal 9520 (a second step 9102). The information on the internal medicine A includes information on components of the internal medicine A and the like. Next, as described above, information on an internal medicine B which is the object B 9522 is obtained by the antenna incorporated in the terminal 9520 (a third step 9103). The information on the internal medicine B includes information on components of the internal medicine B and the like. Thus, information of a plurality of internal medicines is obtained. The combination information is compared to the obtained information of a plurality of internal medicines, thereby determining whether a corresponding combination of internal medicines which are dangerous when used at the same time is contained (a fourth step 9104). If the corresponding combination is contained, the user of the terminal 9520 is alerted (a fifth step 9105). If the corresponding combination is not contained, the user of the terminal 9520 is informed of the safety (a sixth step 9106). In the fifth step 9105 and the sixth step 9106, in order to inform the user of the terminal 9520, the information may be displayed on the display portion 9521 of the terminal 9520, or an alarm of the terminal or the like may be sounded.

This embodiment can be freely combined with embodiment modes described above.

This application is based on Japanese Patent Application serial No. 2005-300971 filed in Japan Patent Office on Oct. 14, 2005, the entire contents of which are hereby incorporated by reference.

EXPLANATION OF REFERENCE

200: region, 201: semiconductor device, 202: coiled antenna, 203: semiconductor integrated circuit, 220: part of a wiring, 221*a*: terminal, 221*b*: terminal, 222*a*: one end, 222*b*: the other end, 300: region, 301: semiconductor device, 302: coiled antenna, 303: semiconductor integrated circuit, 304: reader/writer, 305: coiled antenna, 306: AC magnetic field, 331*a*: terminal, 331*b*: terminal, 332*a*: one end, 332*b*: the other end, 401: capacitor, 402: capacitor, 403: capacitor, 501: resonant capacitor, 502: band-pass filter, 503: power supply circuit, 504: demodulation circuit 505: modulation circuit, 506: code extraction circuit 507: clock generation circuit, 508: cyclic redundancy check circuit, 509: control circuit, 510: memory circuit, 600: substrate, 601: substrate, 603: conductive material, 604: adhesive agent, 661: base film, 662: semiconductor active layer, 662*a*: channel forming region, 662*b*: source and drain regions, 662*c*: LDD region, 663: gate insulating film, 664: gate electrode, 665: interlayer insulating film, 666: wiring, 666*a*: wiring, 666*b*: wiring, 667: protective film, 671: interlayer insulating film, 681: semiconductor layer, 682: conductive layer, 683: conductive layer, 691: transistor, 692: transistor, 693: transistor, 695: insulating film, 801: region, 802: region, 803: region, 881: first power source line, 882: second power source line, 883: intersection portion, 884: intersection portion, 885: intersection portion, 886: intersection portion, 887*a*: contact hole, 887*b*: contact hole, 888: wiring, 9001: first step, 9002: second step, 9003: third step, 9004: fourth step, 9005: fifth step, 9101: first step, 9102: second step, 9103: third step, 9104: fourth step, 9105: fifth step, 9106: sixth step, 9520: terminal, 9521: display portion, 9522: object B, 9523: semiconductor device, 9531: semiconductor device, and 9532: object A.

The invention claimed is:
1. A semiconductor device comprising:
a first substrate;
a semiconductor integrated circuit over the first substrate;
a power source line comprising:
   a first wiring over the first substrate;
   a second wiring over the first substrate;
   a first insulating film over the first wiring and the second wiring;
   a third wiring over the first insulating film; and
   a fourth wiring over the first insulating film;
an adhesive agent over the semiconductor integrated circuit;
a coiled antenna over the adhesive agent, the coiled antenna being electrically connected to the semiconductor integrated circuit; and
a second substrate over the coiled antenna,
wherein the coiled antenna is provided with the second substrate,
wherein the first wiring and the third wiring are electrically connected to each other through a first contact,
wherein the first wiring and the fourth wiring are electrically connected to each other through a second contact,
wherein the second wiring and the third wiring are electrically connected to each other through a third contact,
wherein the second wiring and the fourth wiring are electrically connected to each other through a fourth contact,
wherein a part of the semiconductor integrated circuit is arranged in a region surrounded by the first wiring, the second wiring, the third wiring, and the fourth wiring,
wherein the semiconductor integrated circuit is arranged so as to overlap with the coiled antenna, and
wherein the semiconductor device communicates data by wireless communication.

2. A semiconductor device comprising:
a first substrate and a second substrate;
a semiconductor integrated circuit over the first substrate;
a power source line comprising:
   a first wiring over the first substrate;
   a second wiring over the first substrate;
   a first insulating film over the first wiring and the second wiring;
   a third wiring over the first insulating film; and
   a fourth wiring over the first insulating film; and
a coiled antenna being electrically connected to the semiconductor integrated circuit,
wherein the coiled antenna is provided with the second substrate,
wherein the first wiring and the third wiring are electrically connected to each other through a first contact,
wherein the first wiring and the fourth wiring are electrically connected to each other through a second contact,
wherein the second wiring and the third wiring are electrically connected to each other through a third contact,
wherein the second wiring and the fourth wiring are electrically connected to each other through a fourth contact,
wherein a part of the semiconductor integrated circuit is arranged in a region surrounded by the first wiring, the second wiring, the third wiring, and the fourth wiring,
wherein the semiconductor integrated circuit comprises a digital circuit and an analog circuit,
wherein the digital circuit is arranged so as to overlap with the coiled antenna, and
wherein the semiconductor device communicates data by wireless communication.

3. A semiconductor device comprising:
a coiled antenna;
a semiconductor integrated circuit electrically connected to the coiled antenna, the semiconductor integrated circuit comprising an element; and a power source line comprising:
  a first wiring over a first substrate;
  a second wiring over the first substrate;
  a first insulating film over the first wiring and the second wiring;
  a third wiring over the first insulating film; and
  a fourth wiring over the first insulating film,
wherein the first wiring and the third wiring are electrically connected to each other through a first contact,
wherein the first wiring and the fourth wiring are electrically connected to each other through a second contact,
wherein the second wiring and the third wiring are electrically connected to each other through a third contact,
wherein the second wiring and the fourth wiring are electrically connected to each other through a fourth contact,
wherein the element is arranged in a region surrounded by the first wiring, the second wiring, the third wiring, and the fourth wiring,
wherein the semiconductor integrated circuit is arranged so as to overlap with the coiled antenna; and
wherein the semiconductor device communicates data by wireless communication.

4. A semiconductor device comprising:
a first substrate;
a semiconductor integrated circuit over the first substrate;
a power source line comprising:
  a first wiring over the first substrate;
  a second wiring over the first substrate;
  a first insulating film over the first wiring and the second wiring;
  a third wiring over the first insulating film; and
  a fourth wiring over the first insulating film;
an adhesive agent over the semiconductor integrated circuit;
a coiled antenna over the adhesive agent, the coiled antenna being electrically connected to the semiconductor integrated circuit; and
a second substrate over the coiled antenna,
wherein the coiled antenna is provided with the second substrate,
wherein the first wiring and the third wiring are electrically connected to each other through a first contact,
wherein the first wiring and the fourth wiring are electrically connected to each other through a second contact,
wherein the second wiring and the third wiring are electrically connected to each other through a third contact,
wherein the second wiring and the fourth wiring are electrically connected to each other through a fourth contact,
wherein a part of the semiconductor integrated circuit is arranged in a region surrounded by the first wiring, the second wiring, the third wiring, and the fourth wiring,
wherein the semiconductor integrated circuit comprises a digital circuit and an analog circuit,
wherein the digital circuit is arranged so as to overlap with the coiled antenna, and
wherein the semiconductor device communicates data by wireless communication.

5. A semiconductor device comprising:
a substrate;
a semiconductor integrated circuit over the substrate, the semiconductor integrated circuit comprising an element;
a power source line comprising:
  a first wiring over a first substrate;
  a second wiring over the first substrate;
  a first insulating film over the first wiring and the second wiring;
  a third wiring over the first insulating film; and
  a fourth wiring over the first insulating film,
an adhesive agent over the semiconductor integrated circuit and the power source line; and
a coiled antenna over the adhesive agent, the coiled antenna being electrically connected to the semiconductor integrated circuit,
wherein the first wiring and the third wiring are electrically connected to each other through a first contact,
wherein the first wiring and the fourth wiring are electrically connected to each other through a second contact,
wherein the second wiring and the third wiring are electrically connected to each other through a third contact,
wherein the second wiring and the fourth wiring are electrically connected to each other through a fourth contact,
wherein the element is arranged in a region surrounded by the first wiring, the second wiring, the third wiring, and the fourth wiring,
wherein the semiconductor integrated circuit is arranged so as to overlap with the coiled antenna, and
wherein the semiconductor device communicates data by wireless communication.

6. A semiconductor device comprising:
a coiled antenna;
a semiconductor integrated circuit electrically connected to the coiled antenna, wherein the semiconductor integrated circuit comprises a digital circuit and an analog circuit; and
a power source line comprising:
  a first wiring over a first substrate;
  a second wiring over the first substrate;
  a first insulating film over the first wiring and the second wiring;
  a third wiring over the first insulating film; and
  a fourth wiring over the first insulating film,
wherein the first wiring and the third wiring are electrically connected to each other through a first contact,
wherein the first wiring and the fourth wiring are electrically connected to each other through a second contact,
wherein the second wiring and the third wiring are electrically connected to each other through a third contact,
wherein the second wiring and the fourth wiring are electrically connected to each other through a fourth contact,
wherein at least one of a part of the digital circuit and a part of the analog circuit is arranged in a region surrounded by the first wiring, the second wiring, the third wiring, and the fourth wiring,
wherein the digital circuit is arranged so as to overlap with the coiled antenna, and
wherein the semiconductor device communicates data by wireless communication.

7. The semiconductor device according to claim 4, wherein at least one of a part of the digital circuit and a part of the analog circuit is arranged in the region surrounded by the first wiring, the second wiring, the third wiring, and the fourth wiring.

8. A semiconductor device according to any one of claims 1 to 6 further comprising:
a capacitor being arranged so as to overlap with the coiled antenna.

9. A semiconductor device according to any one of claims 1 to 6 further comprising:
a capacitor comprising a part of a wiring of the coiled antenna, a part of a wiring of the semiconductor integrated circuit, and an insulating film interposed therebetween.

10. A semiconductor device according to claim 9,
wherein the part of the wiring in the semiconductor integrated circuit is applied a predetermined potential.

11. A semiconductor device according to any one of claims 3, 5, and 6 further comprising:
a capacitor comprising a part of a wiring of the coiled antenna, the power source line, and an insulating film interposed therebetween,
wherein the capacitor is arranged so as to overlap with the coiled antenna.

12. A semiconductor device according to claim 8,
wherein the capacitor is electrically connected to the coiled antenna.

13. A semiconductor device according to claim 8,
wherein the capacitor is a resonant capacitor connected to the coiled antenna in parallel.

14. A semiconductor device according to claim 8,
wherein the capacitor is a storage capacitor for holding power source voltage of the semiconductor integrated circuit.

15. A semiconductor device according to any one of claims 1 to 6,
wherein the coiled antenna is selected from group consisting of a circular coiled antenna, a triangular coiled antenna, a square coiled antenna, and a polygonal coiled antenna.

16. A semiconductor device according to any one of claims 1 to 6,
wherein the semiconductor integrated circuit is operated by electromotive force generated by electromagnetic induction in the coiled antenna, as power source voltage.

17. A semiconductor device according to any one of claims 1, 3, and 5,
wherein the coiled antenna and the semiconductor integrated circuit are formed over a same substrate.

18. A semiconductor device according to any one of claims 1, 3, and 5,
wherein the semiconductor integrated circuit is formed by using a single crystal semiconductor substrate.

19. A semiconductor device according to any one of claims 1 to 6,
wherein the semiconductor integrated circuit is formed over an insulating substrate by using a thin film transistor.

20. A communication system comprising:
the semiconductor device according to any one of claims 1 to 6;
an antenna and a reader/writer each of which communicates data with the semiconductor device.

21. A semiconductor device according to any one of claims 1 to 6, further comprising:
an interlayer insulating film over the semiconductor integrated circuit,
a conductive material over the interlayer insulating film,
wherein the semiconductor integrated circuit is electrically connected to the coiled antenna via the conductive material.

22. A semiconductor device according to any one of claims 1, 2, and 4, further comprising:
a protective film interposed between the second substrate and the adhesive agent.

23. A semiconductor device according to claim 1, further comprising:
a capacitor comprising:
a semiconductor layer over the first substrate;
a second insulating film over the semiconductor layer; and
a conductive layer over the second insulating film,
wherein the semiconductor layer and the conductive layer are overlapped with each other.

24. A semiconductor device according to claim 1, further comprising:
a first capacitor comprising:
a semiconductor layer over the first substrate;
a second insulating film over the semiconductor layer; and
a conductive layer over the second insulating film, and
a second capacitor comprising:
the conductive layer over the second insulating film;
the first insulating film over the conductive layer; and
a part of the coiled antenna over the first insulating film,
wherein the semiconductor layer and the conductive layer are overlapped with each other, and
wherein the conductive layer and the part of the coiled antenna are overlapped with each other.

* * * * *